United States Patent
Park et al.

(10) Patent No.: US 7,973,346 B2
(45) Date of Patent: Jul. 5, 2011

(54) IMAGE SENSOR WITH SELF-BOOSTING TRANSFER TRANSISTOR GATE AND METHODS OF OPERATING AND FABRICATING THE SAME

(75) Inventors: Young-Hoon Park, Suwon-si (KR); Won-Je Park, Suwon-si (KR); Tae-Seok Oh, Seoul (KR); Jae-Ho Song, Suwon-si (KR)

(73) Assignee: Samsung Electronic Co., Ltd., Suwon-Si (KR)

( * ) Notice: Subject to any disclaimer, the term of this patent is extended or adjusted under 35 U.S.C. 154(b) by 238 days.

(21) Appl. No.: 11/335,925

(22) Filed: Jan. 18, 2006

(65) Prior Publication Data

US 2006/0157761 A1    Jul. 20, 2006

(30) Foreign Application Priority Data

Jan. 19, 2005  (KR) .................. 10-2005-0005007

(51) Int. Cl.
*H01L 31/062* (2006.01)
*H01L 31/06* (2006.01)
(52) U.S. Cl. ........................ 257/292; 257/462
(58) Field of Classification Search ......... 257/290–293, 257/461, 462, E27.132, E27.133, 133
See application file for complete search history.

(56) References Cited

U.S. PATENT DOCUMENTS

| | | | | |
|---|---|---|---|---|
| 4,902,637 A | * | 2/1990 | Kondou et al. | 438/152 |
| 6,521,924 B2 | | 2/2003 | Han et al. | 257/290 |
| 6,780,666 B1 | * | 8/2004 | McClure | 438/57 |

FOREIGN PATENT DOCUMENTS

| | | |
|---|---|---|
| JP | 2000-156491 | 6/2000 |
| JP | 2001-250934 | 9/2001 |
| KR | 2001-0061346 | 7/2001 |
| KR | 2003-0084492 | 1/2003 |

* cited by examiner

*Primary Examiner* — Hung Vu
(74) *Attorney, Agent, or Firm* — F. Chau & Associates, LLC

(57) ABSTRACT

Disclosed is a image sensor (e.g., a CMOS image sensor) including pixels each having a transfer transistor and a drive transistor, in which the gate of at least one of the transistors has a boosting gate disposed over it comprised of a conductive film pattern with interposing an insulation film. Thus, a voltage applied to the boosting gate is capacitively coupled to at least one of the transfer gate of the transfer transistor and a drive gate of the drive transistor. The transfer gate is supplied with the sum of the transfer voltage and the boosting gate-coupling voltage as a result and there is no need for providing a high voltage generator for the image sensor. The dynamic range of operation may be enhanced if such a coupling voltage is applied to the drive gate of the drive transistor.

6 Claims, 22 Drawing Sheets

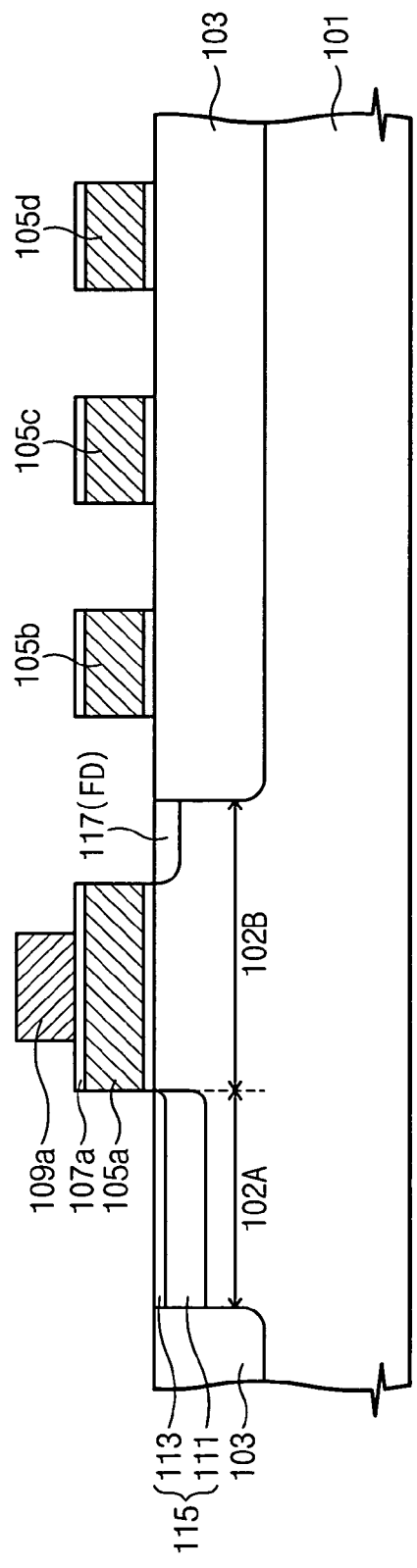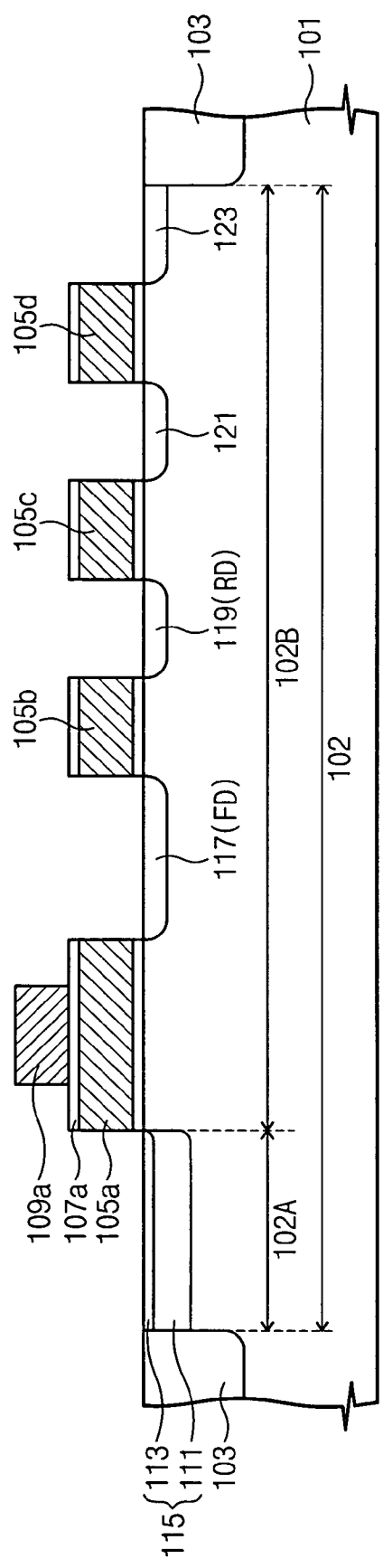

IMAGE SENSOR WITH SELF-BOOSTING TRANSFER TRANSISTOR GATE AND METHODS OF OPERATING AND FABRICATING THE SAME

CROSS-REFERENCE TO RELATED APPLICATIONS

This U.S. non-provisional patent application claims priority under 35 U.S.C. §119 of Korean Patent Application 2005-05007 filed on Jan. 19, 2005, the entire contents of which are hereby incorporated by reference.

BACKGROUND

1. Field of the Invention

The present invention relates to image sensors, and more particularly relates to CMOS image sensors and methods of operating and fabricating the same.

2. Description of the Related Art

The rapid advancement of digital camera technology and a resulting increase of their popularity has made high performance digital cameras in high demand among consumer electronics. The basic components of a digital camera that determine its performance level are an optical lens and an image sensor. The image sensor functions to transform light applied thereto (through the optical lens) into an electronic signal representing an image.

A typical image sensor is composed of a pixel array in which a plurality of pixels are arranged in a two dimensional matrix. Each pixel includes a light detection unit (or a photodetector), and a transmission and signal output (readout) unit. Image sensors may be normally classified into two types: the charge coupled device image sensors (hereinafter, referred to as CCD image sensors); and the complementary metal-oxide-semiconductor image sensors (hereinafter, referred to as CMOS image sensors). The CCD image sensor employs MOS (metal oxide semiconductor, field effect transistor) capacitors for transferring and outputting signals and charge carriers are stored in a capacitor are transferred to an adjacent capacitor, by a potential difference between the capacitors. By comparison, the CMOS image sensor utilizes a switching scheme sequentially detecting output signals of MOS transistors that are formed in the pixels thereof.

Thus, the CCD image sensors are able to take better images than CMOS image sensors because of having less noise therein, but have disadvantages of higher product costs and larger power consumption. In other words, the CMOS image sensors have the advantages of lower power operation, (low power consumption), compatibility with integrated or operatively coupled CMOS circuits, random accessing of image data, reduced cost (e.g., by using standard CMOS techniques), and so forth. Thus, the CMOS image sensors are more widely used for various applications such as digital cameras, smart phones, PDAs, notebook computers, security cameras, barcode sensors, high definition televisions, high resolution cameras, toys, and so on.

FIG. 1A is an equivalent circuit diagram illustrating the pixel structure of a conventional CMOS image sensor including a photo-receiving device and four transistors (hereinafter, referred to as 'four-transistor pixel structure'), and FIG. 1B is a timing diagram illustrating an operation of the CMOS image sensor of FIG. 1A.

Referring to FIG. 1A, the image sensor with four-transistor pixel structure is composed of four transistors, (i.e., a transfer transistor 13, a reset transistor 15, a drive transistor 17, a selection transistor 19), and a photo-receiving device 11.

The typical operation of the four-transistor pixel structure is as follows. Referring to FIG. 1B, a selection voltage $\phi$SG is applied to the (selection) gate of the selection transistor 19 during a signal output period Td, turning the selection transistor 19 ON. After the selection transistor 19 is turned ON, a reset voltage $\phi$RG is applied to the (reset) gate RG of the reset transistor 15, by which the reset transistor 15 is turned ON to reset a floating diffusion node 14 to a power supply voltage level VDD approximately. Thereby, the pixel is reset. Then, the supply voltage level VDD is applied to the (drive) gate DG of the drive transistor 17 as a drive voltage $\phi$DG, so that a reference voltage Vref is provided to an output node Vout within a first signal output period Td1.

After resetting the pixel, when light is incident upon the photo-receiving device 11, electron-hole pairs (EHP) are generated proportionally in response to the incident light. And then, if a transfer voltage $\phi$TG is applied to the transfer gate TG, the potential barrier (resistance) between the photo-receiving device 11 and the floating diffusion node 14 becomes lower (allowing a transfer of signal charges from the photo-receiving device 11 to the floating diffusion node 14). Thereby, the potential at the floating diffusion node 14 varies in proportion with the amount of signal charges transferred thereto. Thus, the drive voltage $\phi$DG applied to the drive gate DG drops down under the initial (supply) voltage VDD, and a (pixel) signal data voltage Vpix appears at an output node Vout within a second signal output period Td2. An image signal is output as a value arising from a difference value Vsig between the reference voltage Vref and the signal data voltage Vpix.

As such, it is very important to entirely transfer the signal charges, which are generated at the photo-receiving device 11, to the floating diffusion node 14 through the transfer gate TG. If the signal charges generated remain in the photo-receiving device 11 without being wholly transferred to the floating diffusion node 14, the remaining signal charges causes the phenomenon of "image lagging" that leaves afterimages in the next frame, resulting in degradation of picture quality in the image sensor.

SUMMARY OF THE INVENTION

Various aspects of the present invention provide an image sensor, for example, a CMOS image sensor, and other aspects of the invention may be applicable to provide another type of image sensor, e.g., a CCD image sensor. Exemplary embodiments of the invention provide a CMOS image sensor having the four-transistor pixel structure, wherein at least one of the (four) transistors (e.g., the Transfer transistor, and/or a Drive Transistor) has a stacked gate structure that provides a capacitive self-boosting effect. The boosting effect may be applied to elevate a bias voltage applied to the transfer gate or to reduce an electrostatic potential.

An aspect of the present invention prevents the "image lagging" effect in the image sensor, e.g., by elevating a bias voltage applied to the transfer gate or reducing an electrostatic potential at the photo-receiving device. As the bias voltage to the transfer gate becomes higher, the potential barrier between the photo-receiving device and the floating diffusion node becomes lower. Also, the lower potential at the photo-receiving device lowers the potential barrier between the photo-receiving device and the floating diffusion node.

However, the scheme that increases the bias voltage to the transfer gate needs to forcibly increase the bias voltage of the transfer gate by means of a high voltage generator that supplies a high voltage to the transfer gate. Meanwhile, the scheme of lowering the potential at the photo-receiving device causes a decrease of charge accumulation capacity in the photo-receiving device and an overflow of signal charges.

Accordingly, embodiments of the present invention provide a high quality image sensor and methods of operating and fabrication the same.

An aspect of the invention provides a CMOS image sensor comprised of a photo-receiving device (e.g., a photodiode), and a signal transformer converting signal charges of the photo-receiving device into voltages. The signal transformer includes a transfer gate, a reset gate, a drive gate, and a selection gate. Thus, each pixel of the image sensor is composed of the photo-receiving device, the transfer gate, the reset gate, the drive gate, and the selection gate. The control gate controls the operation of transferring the signal charges from the photo-receiving device to a floating diffusion region that is a charge storage area. For this, a transfer voltage is applied to the transfer gate as a control signal. The reset gate controls an operation of initializing (resetting) the signal charges of the floating diffusion region, for which a reset voltage is applied to the reset gate as a control signal. The drive gate is connected to the floating diffusion region, sensing a potential corresponding to the signal charges transferred to the floating diffusion region. The selection gate controls the operation of outputting the sensed potential, for which a selection voltage is applied to the selection gate as a control signal.

In the exemplary embodiments of the invention shown in the figures, a boosting gate is disposed over one of the transfer and drive gates with an interposing (high-dielectric) insulation film. Thereby, the transfer gate, the dielectric film, and the boosting gate function as a capacitor. Similarly, the drive gate, the dielectric film, and the boosting gate function as a capacitor. Thus, a bias voltage (boosting voltage) applied to the boosting gate is coupled with the transfer gate and/or the drive gate. As a result, the transfer gate is supplied with the sum of the voltage of the transfer voltage directly applied thereto and the voltage (boosting gate-coupling voltage) coupled thereto by the boosting voltage applied to the boosting gate pattern. Similarly, with a driving gate-coupling voltage (i.e., the boosting gate-coupling voltage) coupled to the drive gate by the boosting voltage, the floating diffusion region is variable in potential and thereby a dynamic range of the image sensor is enlarged.

When after applying the transfer voltage to the transfer gate and floating the transfer gate, the boosting voltage is applied to the boosting gate pattern, the transfer gate is supplied with the sum of the transfer voltage and the boosting gate-coupling voltage as a result. As the boosting gate-coupling voltage (i.e., a transfer coupling voltage) as well as the transfer voltage is applied to the transfer gate, the transfer voltage and the boosting voltage applied to the boosting gate do not need to be (externally supplied) high voltages. Therefore, it is unnecessary to provide a high-voltage generator.

Preferably, the boosting gate is electrically connected to the selection gate. In other words, the selection voltage applied to the selection gate is simultaneously applied also to the boosting gate as the boosting voltage. Thus, there is no need of an additional voltage supply source for supplying the boosting voltage. And, it is easy to supply the boosting voltage to the boosting gate just by using the selection voltage applied directly to the boosting gate pattern.

The photo-receiving device may be a photodiode, a phototransistor, a pinned photodiode, a photogate, a MOSFET, or so forth, without limited to a specific one.

Embodiments of the invention also provide a method of fabricating each pixel of an image sensor. The method comprises: confining an active region in a semiconductor substrate by a field isolation process; sequentially forming a first conductive film, a dielectric film, and a second conductive film on the semiconductor substrate; forming a boosting gate (pattern) from the second conductive film (e.g., by conducting a first photolithography and etching process); forming a transfer gate, a reset gate, a drive gate, and a selection gate from the first conductive film (e.g., by conducting a second photolithography and etching process against the first dielectric film); forming a photo-receiving device; and forming a local interconnection line to electrically connect the boosting gate(s), which is disposed over the transfer gate and/or the drive gate, to the selection gate(s) of pixels.

The method may further comprise forming an analog capacitor in a peripheral circuit area. In this case, while forming the boosting gate from patterning the second conductive film by means of the first photolithography and etching process, the second conductive film of the peripheral circuit area is patterned to form the top electrode of the analog capacitor at the same time. And, while forming the transfer gate, the reset gate, the drive gate, and the selection gate from patterning the dielectric film and the first conductive film by means of the second photolithography and etching process, the dielectric film and the first conductive film those positioned in the peripheral circuit area are patterned to form a dielectric film and the bottom electrode of the analog capacitor at the same time.

In this method, since the boosting gate (pattern) is disposed over the transfer gate (adjacent to the photo-receiving device), it does not cause an injection of ionic impurities into the substrate under the transfer gate even though there may be a misalignment during an ion implantation process for forming the photo-receiving device.

BRIEF DESCRIPTION OF THE DRAWINGS

Embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. The accompanying drawings are included to provide a further understanding of the invention, and are incorporated in and constitute a part of this specification. The drawings illustrate exemplary embodiments of the present invention and, together with the description, serve to explain principles of the present invention. In the drawings, the thickness of layers and regions are exaggerated for clarity. It will also be understood that when a layer is referred to as being on another layer or substrate, it can be directly on the other layer or substrate, or intervening layers may also be present. In the drawings, like numerals and labels refer to like elements throughout the specification, and:

FIGS. 8A through 13A and 8B through 13B are sectional diagrams illustrating processing steps for fabricating the image sensor show in FIGS. 2A through 2C, FIGS. 8A through 13A being taken along the section line I-I of FIG. 2A while FIGS. 8B through 13B being taken along the section line II-II of FIG. 2A.

DETAILED DESCRIPTION OF PREFERRED EMBODIMENTS

Figure 2A:
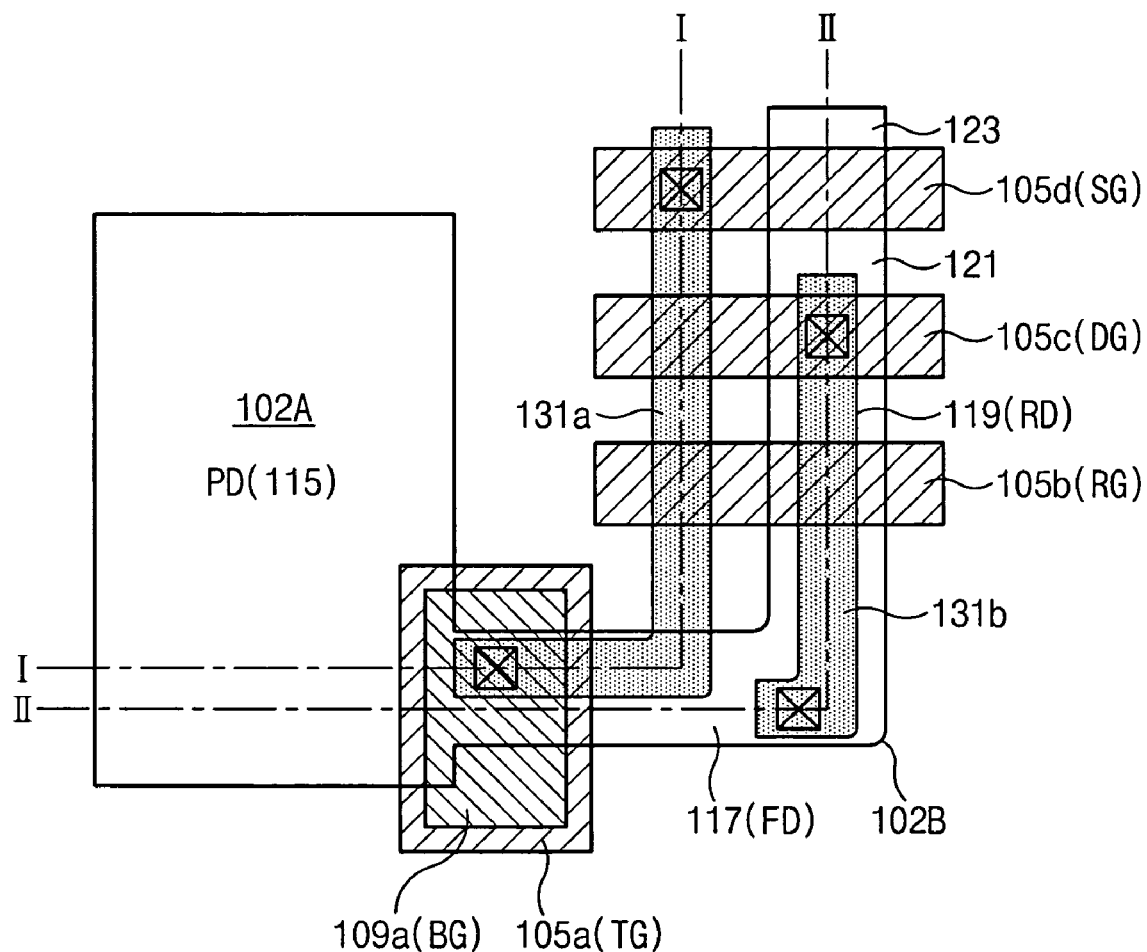
FIG. 2A is a top view of an image sensor having a four transistor pixel structure in accordance with a preferred embodiment of the invention.
Figure 2B:
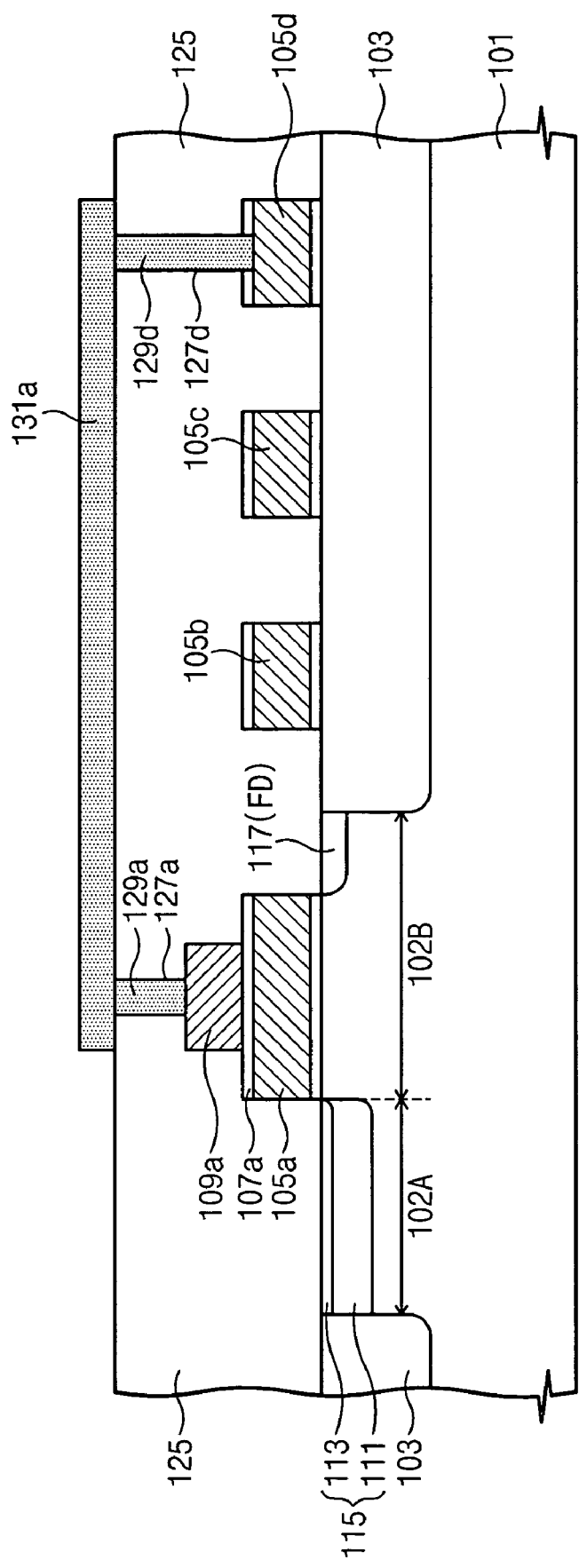
FIG. 2B is a sectional view along the section line I-I of FIG. 2A.

FIG. 2A is a top view of an integrated image sensor having a four-transistor pixel structure in accordance with an embodiment of the invention. FIG. 2B is a sectional view along the section line I-I of FIG. 2A, and FIG. 2C is a sectional view along the section line II-II of FIG. 2A.

Figure 2C:
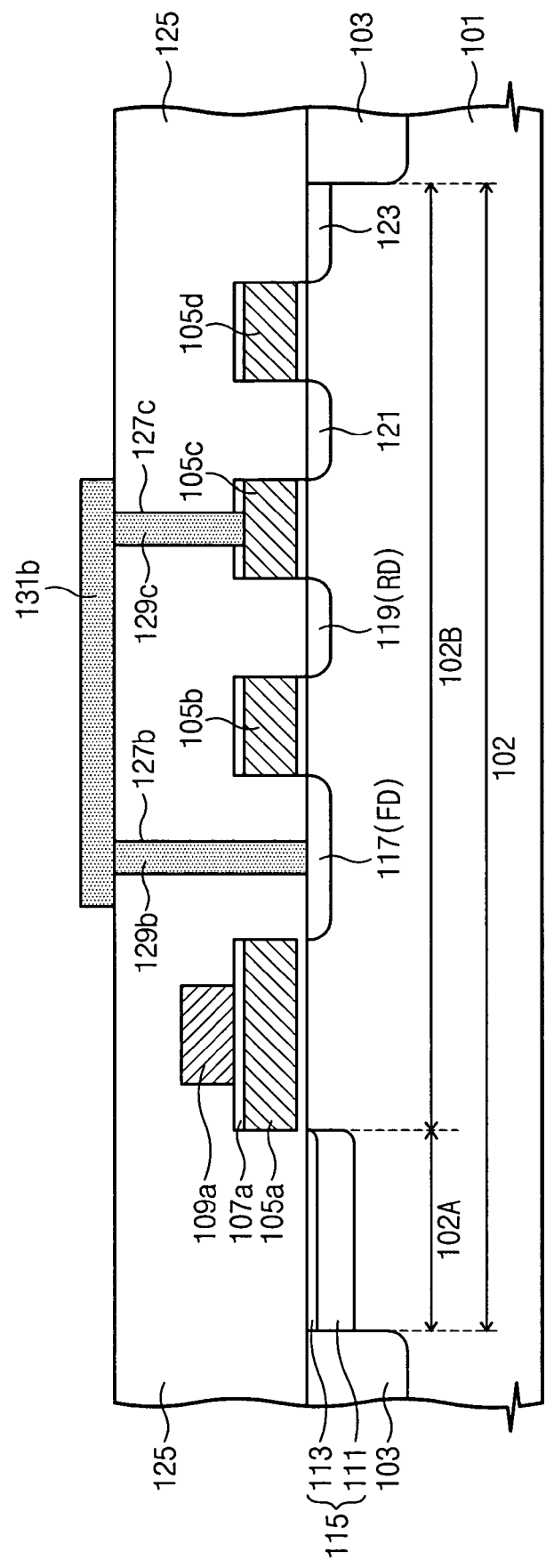
FIG. 2C is a sectional view along the section line II-II of FIG. 2A.

Referring FIGS. 2A through 2C, the CMOS image sensor includes a plurality of pixels, and each pixel is composed of a photo-receiving device PD (115) for receiving right, a transfer gate (TG) 105a for transferring signal charges from the photo-receiving device PD (115) to a floating diffusion region (FD) 117, a reset gate (RG) 105b for discharging the signal charges form the floating diffusion region 117 to a reset diffusion region (RD) 119, a drive gate (DG) 105c for outputting a voltage (by amplifying the voltage of the signal charges stored in the floating diffusion region 117), and a selection gate (SG) 105d. A boosting gate 109a (BG) is disposed (patterned) over the transfer gate (TG) 105a, with an interposing dielectric film 107a therebetween. A plurality of pixels each having this structure are arranged in a two-dimensional matrix, forming a pixel array of the image sensor.

The boosting gate 109a is electrically connected to the selection gate 105d by a first local metal line 131 a (and through contact plugs 129a and 129d in the contact holes 127a and 127d, see FIG. 2B). The floating diffusion region 117 is electrically connected to the drive gate 105c by a second local metal line 131b (and through contact plugs 129b and 129c in the contact holes 127b and 127c, see FIG. 2C). The interconnections shown in FIG. 2A, between the boosting gate 109a and the selection gate 105d, and between the floating diffusion region 117 and the drive gate 105c, are just examples and may be modifiable in various other arrangements and patterns.

The photo-receiving device PD 115 is formed in an active region 102A and the gates 105a-105d are formed over another active region 102B. The active regions 102A and 102B are connected to each other, and are electrically isolated from their adjacent active regions by field isolation films 103 (FIGS. 2B & 2C).

The photo-receiving device PD 115 may be a photodiode composed of an N-region 111 and a P-region 113 (e.g., adjacent to each other). The transfer gate 105a (TG) is located adjacent to the photo-receiving device 115. The photo-receiving device 115 is not confined in form to a photodiode, and may instead be implemented as a phototransistor, a pinned photodiode, a photogate, a MOSFET, or so forth.

Referring to FIGS. 2A and 2C, the floating diffusion region 117 (FD) is disposed between the transfer gate 105a and the reset gate 105b. And the reset diffusion region 119 is disposed between the reset gate 105b and the drive gate 105c. A voltage VDD is applied to reset the reset diffusion region 119. The drive gate 105c is disposed between the reset diffusion region 119 (held at voltage VDD) and a first impurity diffusion region 121. The first impurity diffusion region 121 is disposed between the drive gate 105c and the selection gate 105d, and a second impurity diffusion region 123 is disposed between the selection gate 105d and the field isolation film 103.

On the other hand, it is practicable to exchange the positions of the selection gate 105d and the drive gate 105c relative to each other. For example, the reset diffusion region 119 may be designed to be disposed between the reset gate 105b and the selection gate 105c.

Figure 1A:
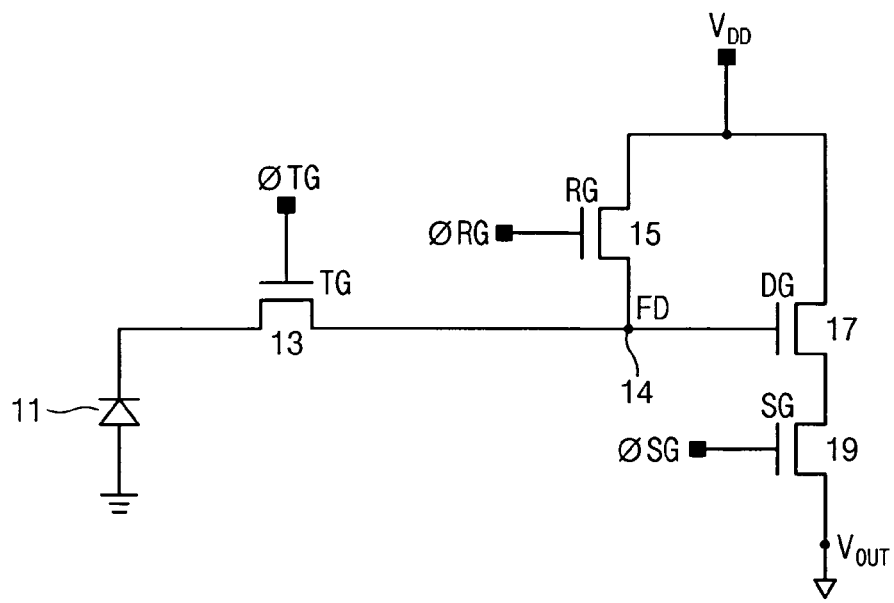
FIG. 1A is a schematic circuit diagram illustrating a pixel structure of a conventional CMOS image sensor including a photo-receiving device and four transistors.
Figure 1B:
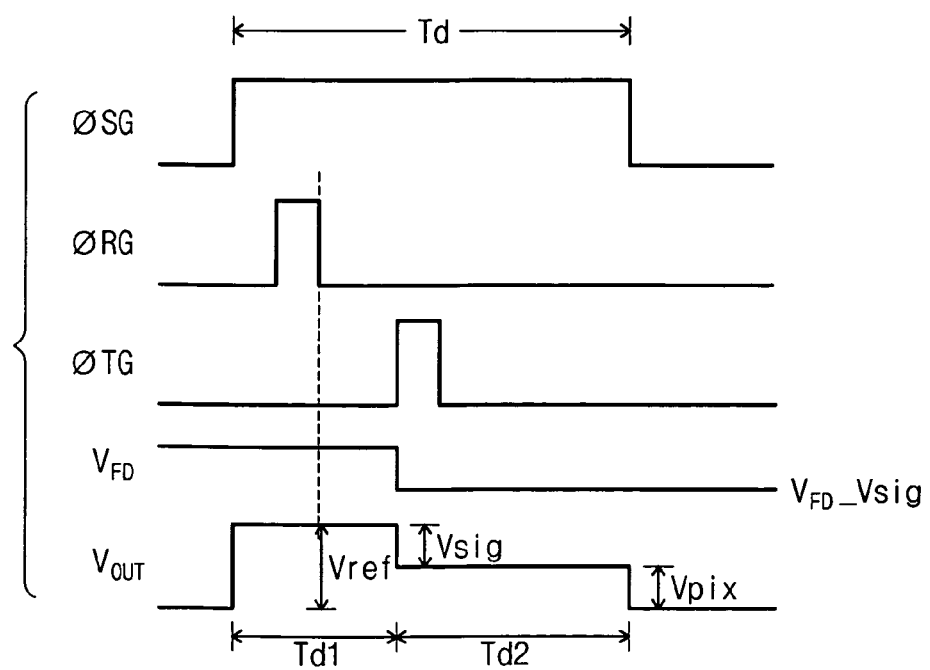
FIG. 1B is a waveform diagram showing an operation by the CMOS image sensor of FIG. 1A.

Differing from a conventional pixel structure (see FIG. 1A), the "four transistor" pixel structure according to an embodiment of the invention comprises the boosting gate 109a that is positioned over the transfer gate 105a with an interposing the dielectric film 107a therebetween. Further, the boosting gate 109a may be electrically connected to the selection gate 105d. Thus, when the transfer gate 105a is floating and a predetermined bias voltage (i.e., selection voltage) φSG is applied, after applying a predetermined bias voltage (i.e., transfer voltage) φTG, to the transfer gate 105a, the boosting gate 109a is charged with a boosting (e.g., boosted) voltage φBG by the selection voltage φSG. Thereby, the boosting voltage φBG makes the floating transfer gate 105a be further coupled with a boosting gate-coupling voltage φCBG. As a result, the transfer gate 105a is charged with the transfer voltage φTG and the boosting gate-coupling voltage φCBG. By this (boosting) mechanism, it is practicable to sufficiently lower the potential barrier between the photo-receiving device 115 and the floating diffusion region 117 without applying an additional (e.g., external) high voltage to the transfer gate 105a, while enhancing the efficiency of transferring signal charges in the CMOS image sensor.

Figure 3:
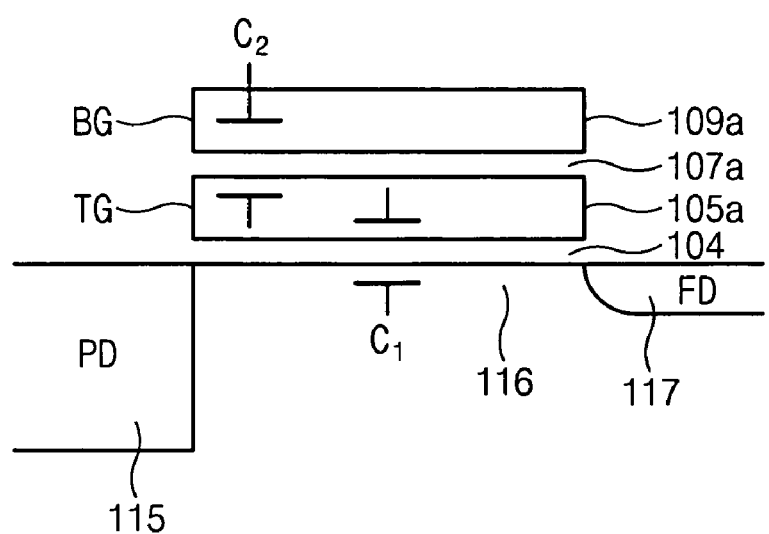
FIG. 3 is a detail from FIG. 2B or 2C illustrating a boosting gate-coupling voltage φBG combined to a transfer gate 105a by a boosting voltage φBG applied to a boosting gate 109a shown in FIGS. 2A through 2C.

FIG. 3 is a detail from FIG. 2B or 2C further illustrating the boosting gate-coupling voltage φCBG combined to the transfer gate 105a (TG) by the boosting voltage φBG applied to the boosting gate 109a as shown in FIGS. 2A through 2C. It is now assumed that C1 denotes the capacitance between the transfer gate 105a and a transfer channel 116 formable between the floating diffusion region 116 and the photo-receiving device 115. And C2 denotes the capacitance between the transfer gate 105a and the boosting gate 109a. Then, a final transfer gate voltage φFTG applied to the transfer gate 105a is defined by the following Equation 1:

$$\phi FTG = \{C1/(C1+C2)\} * \phi BG + \phi TG \qquad \text{[Equation 1]}$$

From Equation 1, it can be seen that the voltage value $\{C1/(C1+C2)\}*\phi BG$, (i.e., corresponding to the boosting gate-coupling voltage φCBG), is applied to the transfer gate 105a in addition to the transfer voltage φTG. Further, it is simple and easy to apply the boosting voltage φBG because the voltage applied to the selection gate 105d is also used for the boosting voltage φBG applied to the boosting gate 109a. For raising a coupling ratio {C1/(C1+C2)} therein, it is preferable for the dielectric film 107a to be formed of a material with high dielectric constant.

Now, a mechanism of transferring signal charges from the photo-receiving device (PD) 115 to the floating diffusion region (FD) 117 will be described with reference to FIGS. 4A through 4D.

FIGS. 4A through 4D are electrostatic potential diagrams illustrating the transfer of signal charges.

Figure 4A:
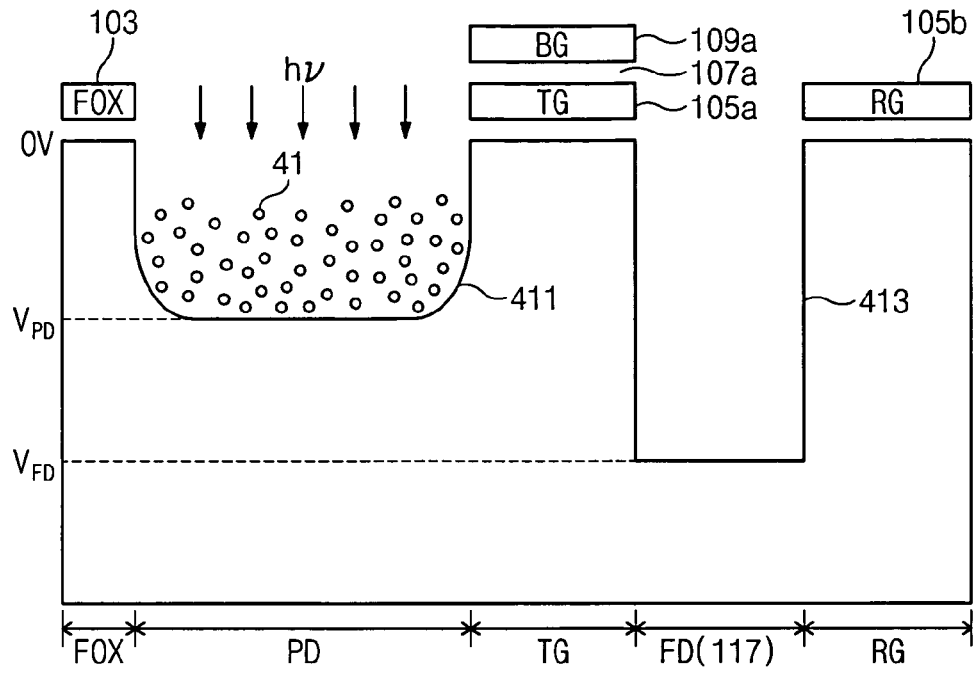
FIGS. 4A through 4D are electrostatic potential views illustrating the transfer of signal charges from a photo-receiving device to a floating diffusion region in an image sensor in accordance with an embodiment of the invention.

FIG. 4A shows the potential in the photo-receiving device PD and in the floating diffusion region FD after completing the reset operation for the pixel. As illustrated in FIG. 4A, between the photo-receiving device PD and the floating diffusion region FG, the transfer gate 105a is located under the boosting gate 109a with interposing the dielectric film 107a therebetween. The reset gate RG is located between the floating diffusion region FD and the reset diffusion region held at voltage VDD (not shown). And, the field isolation film (FOX) 103 is positioned at the other side of the photo-receiving device PD opposite from the transfer gate TG.

The electrostatic potentials of the photo-receiving device PD and the floating diffusion region FD are determined by the concentration of (doping) impurities. For instance, the electrostatic potential under the transfer gate 105a is 0V and the electrostatic potential under the reset gate RG is 0V. The electrostatic potential under the field isolation film (FOX) 103 is 0V. The electrostatic potentials under the transfer gate 105a, the reset gate RG, and the field isolation film 103 may be established in various values without instead of the above values.

If the reset voltage φRG is applied to the reset gate RG and thereby the reset operation is conducted for the pixel, signal charges remaining in the floating diffusion region FD are all removed. Therefore, when light hv is incident upon the photo-receiving device PD after resetting the pixel, pixel signal charges 41 are trapped in a potential well 411 generated by potential differences under the photo-receiving device, the field isolation film, and the transfer gate.

Figure 4B:
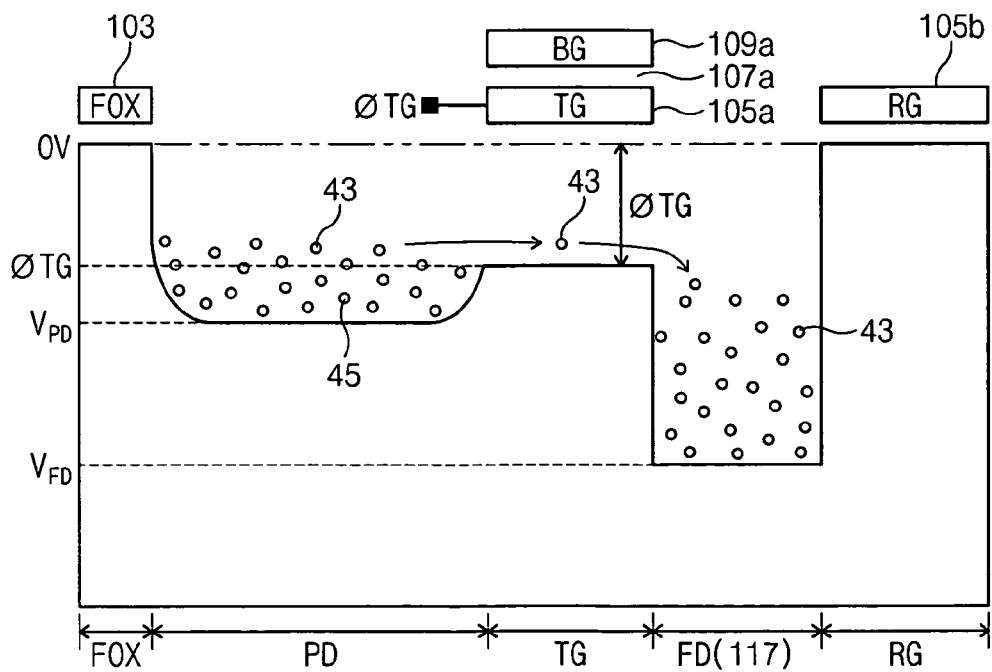

Referring to FIG. 4B, next when the transfer voltage φTG is applied to the transfer gate TG, the electrostatic potential under the transfer gate TG decreases and the potential barrier between the photo-receiving device PD and the floating diffusion region FD is lowered. As a result, the signal charges 43 are transferred to the floating diffusion region FD. Otherwise, unless the transfer voltage φTG applied to the transfer gate TG makes the electrostatic potential thereunder to be sufficiently lowered (i.e., unless the electrostatic potential under the transfer gate TG is lowered to the bottom of the potential well 411), some signal charges 45 may remain at the bottom of the potential well 411.

Figure 4C:
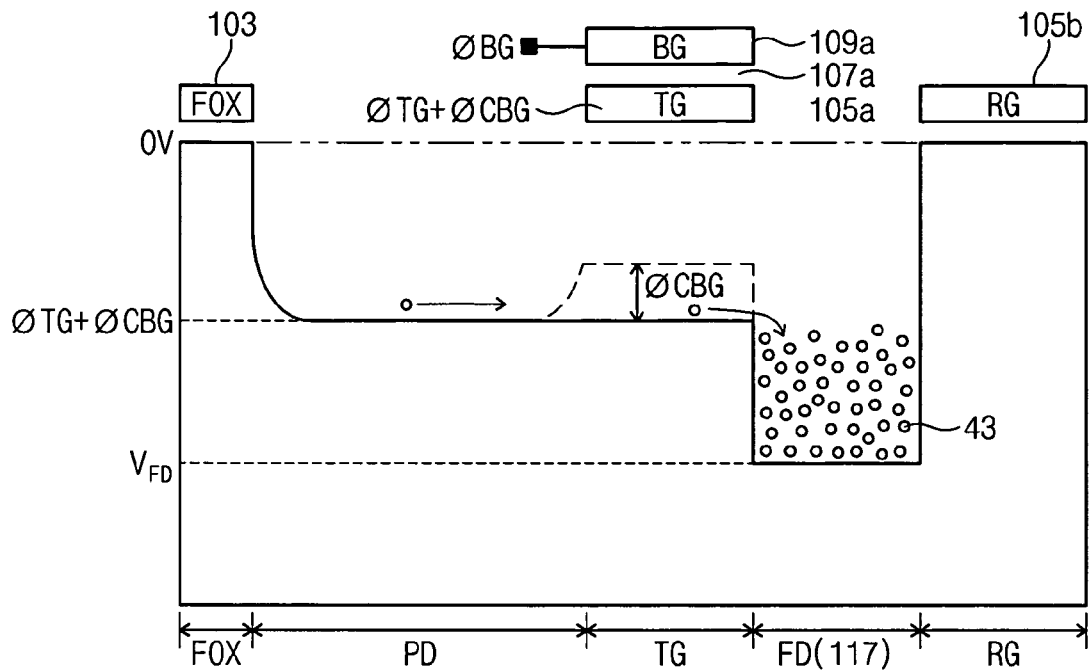

Therefore, according to the invention, for the purpose of completely transferring the (remaining) signal charges 45, which may remain at the bottom of the potential well 411, to the floating diffusion region FD, the boosting voltage φBG is applied to the boosting gate BG over the transfer gate TG (e.g., after removing the transfer voltage φTG applied to the transfer gate TG (i.e., after floating the transfer gate TG)). Thus, the boosting gate-coupling voltage φCBG is further coupled to the transfer gate TG and as illustrated in FIG. 4C, the electrostatic potential under the transfer gate TG is lowered to the bottom of the potential well 411 (or less) and thereby the signal charges 45 remaining at the bottom of the potential well 411 are entirely transferred to the floating diffusion region FD.

Figure 4D:
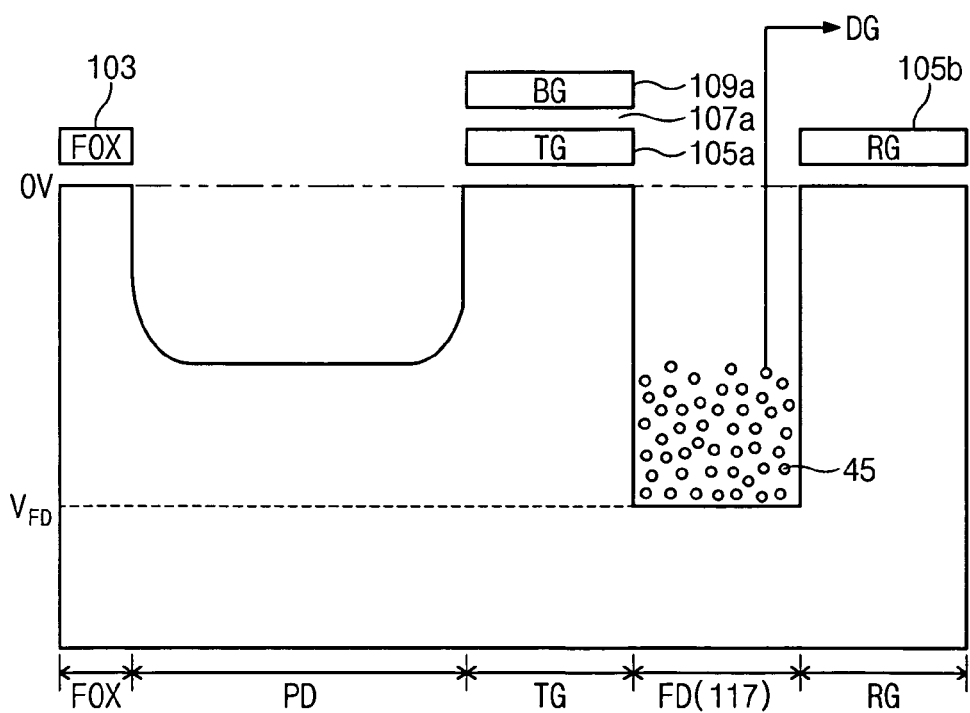

Referring to FIG. 4D, when the boosting voltage φBG is removed from the boosting gate 109a, the remaining signal charges 45 transferred to the floating diffusion region FD are stored in a potential well 413 generated by electrostatic potential differences among the floating diffusion region FD, the substrate under the transfer gate TG, and the substrate under the reset gate RG. Accordingly, the 10 potential of the floating diffusion region FD is changed based on the transferred signal charges 45.

A voltage corresponding to the potential of the floating diffusion region FD, as changed by the signal charges 45 transferred to the floating diffusion region FD, is applied to the drive gate DG as the drive voltage φDG.

Figure 5A:
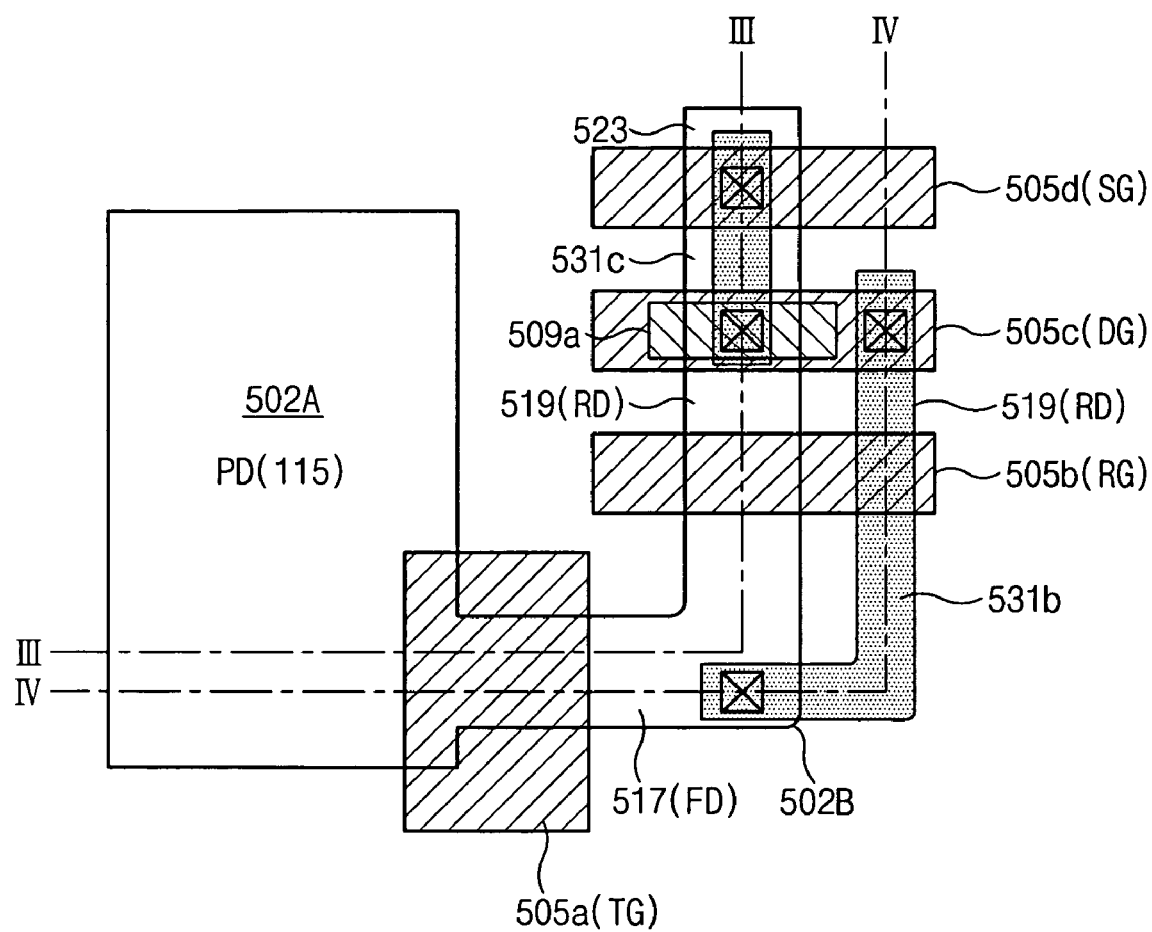
FIG. 5A is a top view illustrating an image sensor having a four transistor structure in accordance with another preferred embodiment of the invention.
Figure 5B:
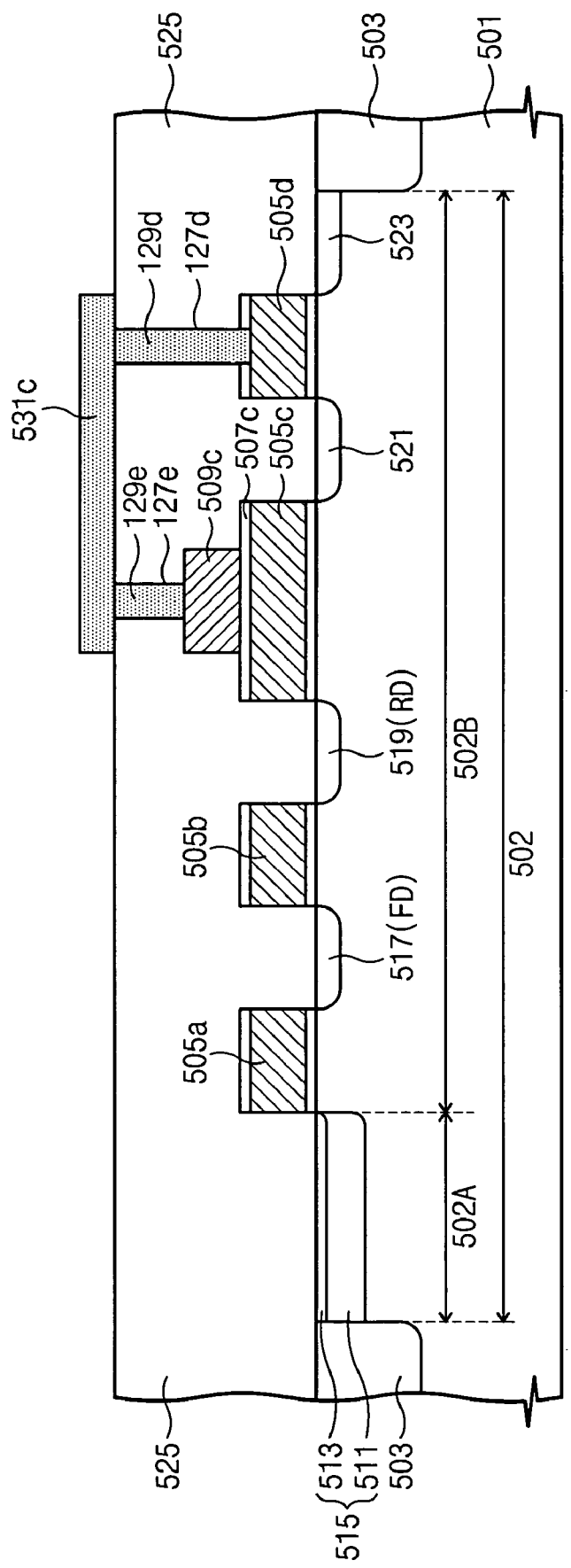
FIG. 5B is a sectional view along the section line I-I of FIG. 5A.

FIG. 5A is a top view illustrating a pixel in an image sensor, pixel having a four-transistor pixel structure in accordance with another embodiment of the invention. FIG. 5B is a sectional view along the section line I-I of FIG. 5A, and FIG. 5C is a sectional view along the section line II-II of FIG. 5A.

Figure 5C:
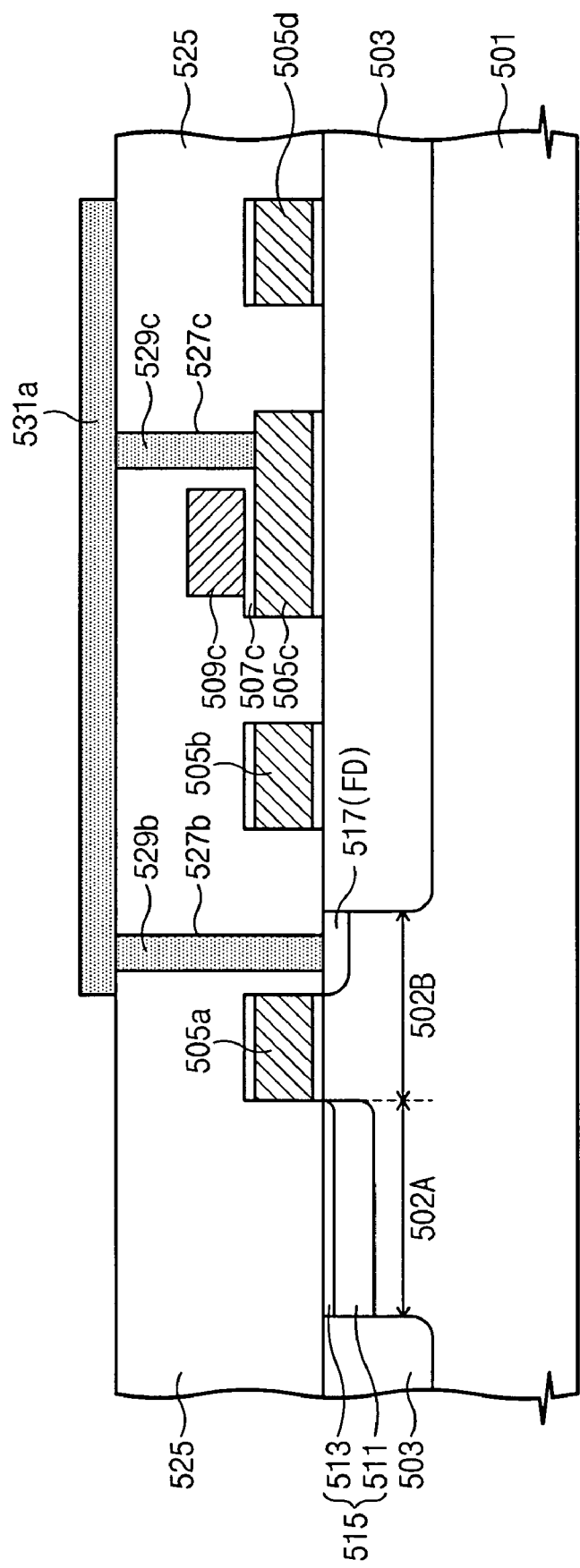
FIG. 5C is a sectional view along the section line II-II of FIG. 5A.

Referring to FIGS. 5A through 5C, the architecture of the pixels of the image sensor according to this embodiment is substantially similar to that of the first embodiment (FIG. 2A), except that a drive gate 505c is located under a boosting gate 509c with interposing a dielectric film 507a therebetween. The boosting gate 509c is again connected to a selection gate 505d.

The local interconnections between the boosting gate 509a and the selection gate 505d, and between a floating diffusion region 517 and the drive gate 505c, are illustrated just as examples and may be modified in various patterns.

According to this embodiment of the invention, the boosting gate-coupling voltage φCBG is generated at the drive gate 505c (e.g., not the transfer gate TG 505a) by the boosting voltage φBG applied to the boosting gate 509c, resulting in a variation of the electrostatic potential in the floating diffusion region 517. For instance, the depth of the potential well 413 (see FIGS. 4A to 4D) may be increased more than it was in the case of FIGS. 4A through 4D. Therefore, the dynamic range of the image sensor may be enlarged.

Operation of the Image Sensor

Figure 6A:
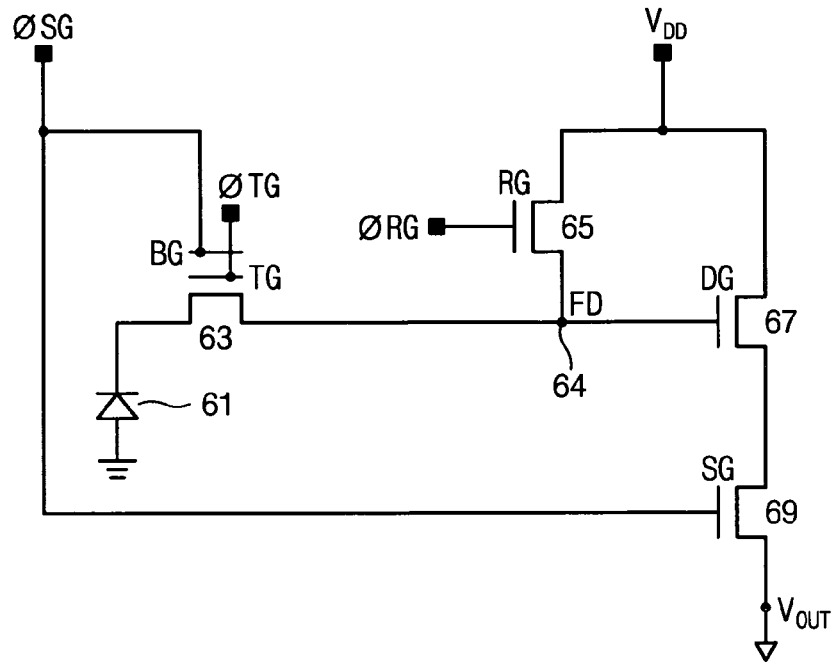
FIG. 6A is a schematic diagram of the image sensor shown in FIGS. 2A through 2C.

FIG. 6A is a schematic diagram of the image sensor shown in FIGS. 2A through 2C, and FIG. 6B is a waveform diagram of signals in the image sensor of FIG. 6A illustrating the operation of the image sensor shown in FIG. 6A.

First, referring to FIG. 6A, each of the pixels of the image sensor according to the first embodiment of the invention is comprised of a photo-receiving device 61, a transfer transistor 63 having stacked gate structure, a reset transistor 65, a drive transistor 67, and a selection transistor 69. The transfer transistor 63 includes a stacked gate structure formed of the transfer gate TG, the high-dielectric film, and the boosting gate BG. The boosting gate BG may be electrically connected to the selection gate SG of the selection transistor 69. The transfer transistor 63 transfers the signal charges that are generated at the photo-receiving device 61, to the floating diffusion region 64.

Figure 6B:
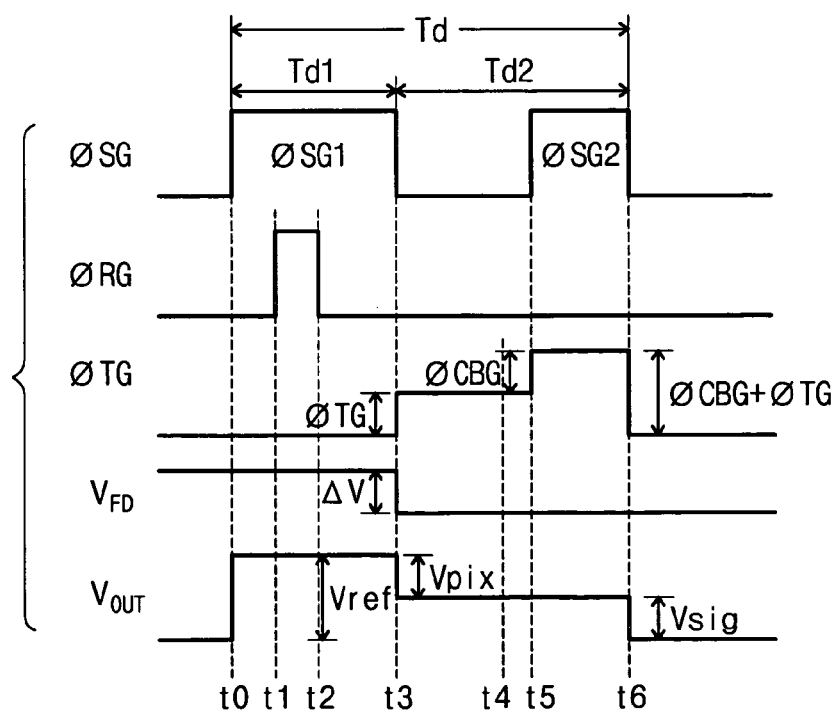
FIG. 6B is a waveform diagram of signals in the image sensor of FIG. 6A illustrating the operation of the image sensor shown in FIG. 6A.

Referring to FIG. 6B, a first selection voltage φSG1 is applied to the selection gate SG of the selection transistor 69 during the first signal output phase Td1 (t0~t3) of the signal output period, which turns the selection transistor 69 ON. After turning the selection transistor 69 ON (at t0), the reset voltage φRG is applied to the reset gate RG of the reset transistor 65 within the period t1~t2 thus turning ON the reset transistor 65 is turned (to make the potential of the floating diffusion region 64 be set to a reference potential VFD, resetting the pixel). Thus, when the voltage corresponding to the reference potential VFD of the floating diffusion region 64 is applied to the drive gate DG of the drive transistor 67 (as the drive voltage φDG) at the time t2, the reference voltage Vref is output to the output node Vout at about time t2.

If light is incident on the photo-receiving device 61 (e.g., from a lens), electron-hole pairs are generated and accumulated therein. After resetting the pixel, if the transfer voltage φTG is applied to the transfer gate TG at the time t3, the potential barrier between the photo-receiving device 61 and the floating diffusion region 64 becomes lower forming a charge transfer channel therebetween. Thus, the signal charges accumulated in the photo-receiving device 61 are transferred to the floating diffusion region 64, and the potential of the floating diffusion region 64 varies in proportion to the amount of the signal charges transferred thereto. As a result, the drive voltage φDG applied to the drive gate DG decreases below the initial reference potential VFD, so that the signal data voltage Vpix appears at the output node Vout from the time t3.

At time t4 in the second signal output phase Td2 (t3~t6), the first selection voltage φSG1 is removed (i.e., inactivated) to float the transfer gate TG.

A second selection voltage φSG2 is further applied to the selection gate SG at the time t5. Then, as the second selection voltage φSG2 is conducted also to the boosting gate BG as the boosting voltage φBG, the resulting boosting gate-coupling voltage φCBG is added to the floated transfer gate TG around the time t5. As a result, the signal charges remaining in the photo-receiving device 61 are transferred to the floating diffusion region 64. The second selection voltage φSG2 is then removed from the selection gate SG at the time t6.

The reference voltage Vref is sampled in the first signal output phase Td1 after the time t2 and the signal data voltage Vpix is sampled in the second signal output phase Td2 after the time t5, so that an image signal is output from the difference value Vsig between the sampled reference voltage Vref and signal data voltage Vpix.

The waveforms shown in FIG. 6B are just illustrative examples, and the dimensions of the signals and voltages and their settling times may be properly variable in various other manners. For example, in the operation of the image sensor having pixels characterized by FIGS. 6A and 6B, the transfer voltage may be applied to the transfer gate TG at the time t4 or between the time t4 and the time t5, and removed at the time t5. Further, the second transfer voltage φSG2 may be applied thereto between the time t3 and the time t4.

Figure 7A:
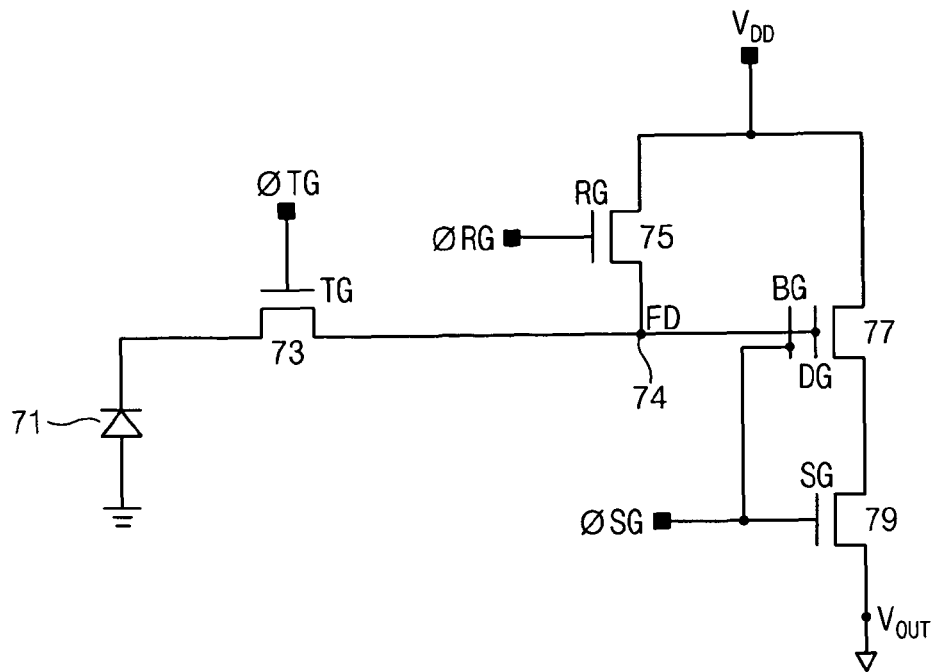
FIG. 7A is a schematic diagram of the image sensor shown in FIGS. 5A through 5C.

FIG. 7A is a schematic diagram of a pixel in an image sensor having a plurality of pixels having the structure shown in FIGS. 5A through 5C, and FIG. 7B is a waveform diagram of signals of the pixel of FIG. 7A illustrating the operation of the pixel the image sensor shown in FIG. 7A.

Figure 7B:
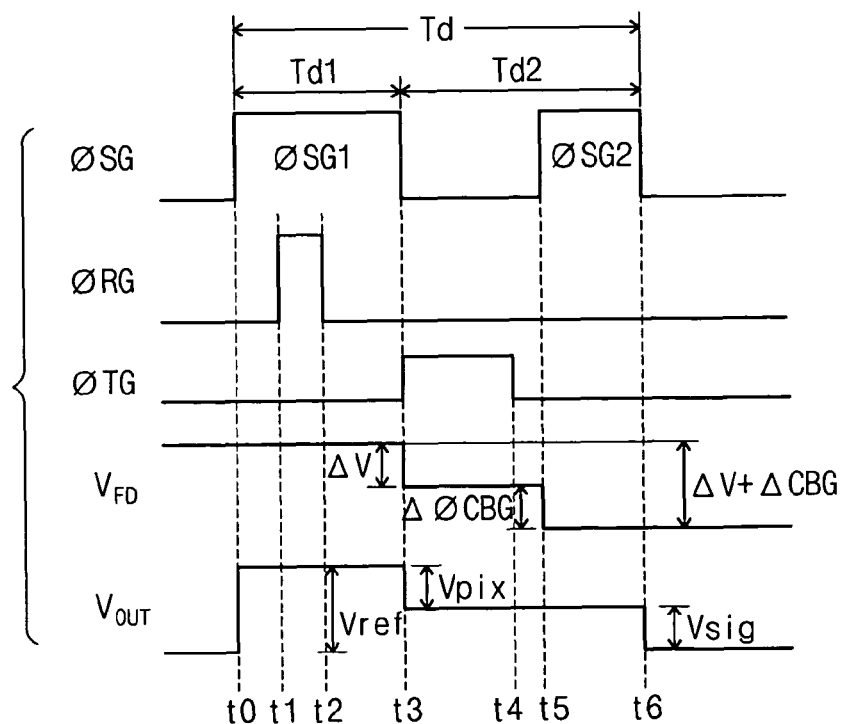
FIG. 7B is a waveform diagram of signals illustrating an operation of the image sensor shown in FIG. 7A.

Referring to FIGS. 7A and 7B, during the first signal output phase Td1 (t0~t3) the first selection voltage φSG1 is applied to the selection gate 79, and the reset transistor RG is turned ON to generate the reference voltage at the output node Vout. At the beginning (the time t3) of the second signal output phase Td2 (t3~t6), the transfer voltage φTG is applied to the transfer gate TG. Thus, the signal charges stored in the photo-receiving device 71 are transferred to the floating diffusion region 74, so that the signal data voltage Vpix starts appearing at the output node Vout. During the term of t5~t6 in the second signal output phase Td2, the second selection voltage φSG2 is additionally applied to the selection gate SG and the boosting gate BG is coupled with the second selection voltage φSG2 as the boosting voltage φBG. As a result, since the boosting gate-coupling voltage φCBG generated by the boosting voltage φDBG is added to the drive gate DG, the potential of the floating diffusion region 74 goes to a higher level from the initial value by ΔV+ΔφCBG. Therefore, the dynamic range of the image sensor can be increased.

In the first exemplary embodiment aforementioned (FIG. 2A), the boosting gate may additionally be disposed over the drive gate 105c with interposing the dielectric film (and electrically connected to the selection gate 105d). And, likewise, in the second embodiment aforementioned (FIG. 5A), the boosting gate may be also disposed over the transfer gate 105c with an interposing dielectric film (and electrically connected to the selection gate 105d).

Moreover, in the first and second embodiments described above, the boosting gate may be also provided over the reset gate with an interposing dielectric film and connected to the selection gate. In this case, the boosting gate over the reset gate acts as a dummy gate without any bias voltage applied thereto.

A method of fabricating the image sensor including pixels having the structure shown in FIGS. 2A through 2C will now be described with reference to FIGS. 8A through 13A and 8B through 13B.

FIGS. 8A through 13A and 8B through 13B are sectional diagrams illustrating processing steps for fabricating the image sensor including pixels having the structure show in FIGS. 2A through 2C. FIGS. 8A through 13A are taken along the section line I-I of FIG. 2A and FIGS. 8B through 13B are taken along the section line II-II of FIG. 2A. The area shown throughout FIGS. 8A to 13B corresponds to a region of the pixel array, excluding a peripheral region including an analog capacitor, and so on. This embodiment is exemplarily practiced to form a CMOS image sensor with a P-type semiconductor substrate, and the pixel comprised of four transistors and a photodiode as the photo-receiving device, but various other embodiments of the invention may be practiced, forming other various CMOS image sensors or CCD image sensors by those skilled in the art, within the scope of the invention.

Figure 8A:
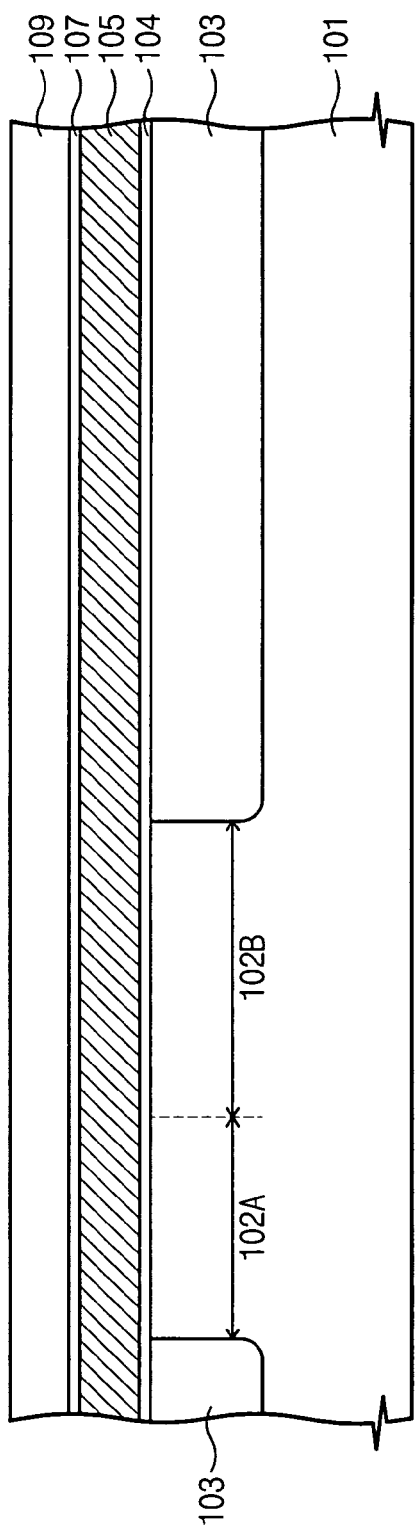
Figure 8B:
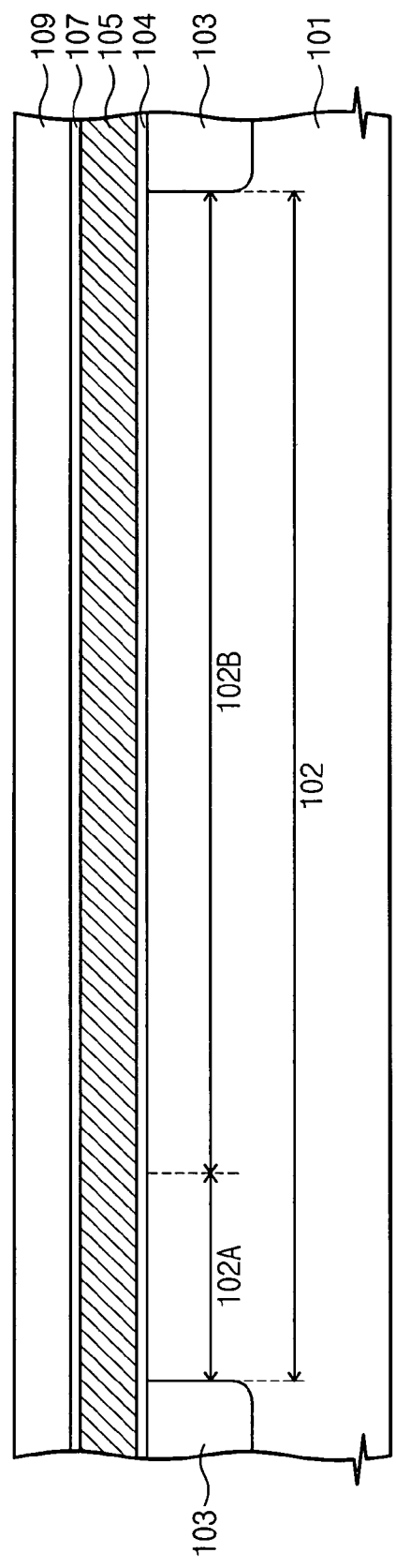

First, referring to FIGS. 8A and 8B, the processing steps of fabricating the image sensor according to an embodiment of the invention begin with preparing a semiconductor substrate 101. The semiconductor substrate 101 may be provided by a wafer cut from Czochralski or float zone of single crystalline bulk silicon, including an epitaxial layer, a buried oxide film, or a doped region in order to improve the characteristic and construct a desired structure. For example, the semiconductor substrate 101 is a P-type substrate doped with impurities such as boron (B).

The field isolation film 103 is formed to confine (isolate) active regions 102 (102A and 102B). The active region 102A is provided to form the photo-receiving device (e.g., photodiode) of one pixel. The active region 102B is provided to form various transistors (e.g., four transistors) of the pixel for transferring the signal charges generated from the photo-receiving device, converting the signal charges into the (pixel) signal data voltage Vpix, and outputting the (pixel) signal data voltage Vpix. The field isolation film 103 may be formed by means of a well-known technique, e.g., by shallow trench isolation (STI).

Referring to FIGS. 8A and 8B, a gate insulation film 104, a first conductive film 105, a dielectric film 107, and a second conductive film 109 (comprising patterned portion 109a shown in FIGS. 9A and 9B), are deposited sequentially (e.g., by known methods). The gate insulation film 104 may be deposited by a thermal oxidation process for example. The first conductive film 105 may be formed of a doped polysilicon, for example. The first conductive film 105 (e.g., "gate poly") is provided for forming the gates constructing the (four) transistors of each pixel in the pixel array area. (And, the first conductive film 105 is also used for the bottom electrode of a capacitor in the peripheral circuit area, not shown). The dielectric film 107 (e.g., a high-dielectric film) may be formed of an oxide-nitride-oxide (ONO) film by depositing an oxide film, a nitride film, and an oxide film, in that order. The second conductive film 109 (comprising patterned boosting gate portion 109a shown in FIGS. 9A and 9B) may be formed of a doped polysilicon (e.g., "gate poly") or a metal. The second conductive film 109 is provided for forming (patterning) the boosting gate (pattern) in the pixel array area. The second conductive film 109 may also be used to form the top electrode of a capacitor in the peripheral circuit area (not shown).

Figure 9A:
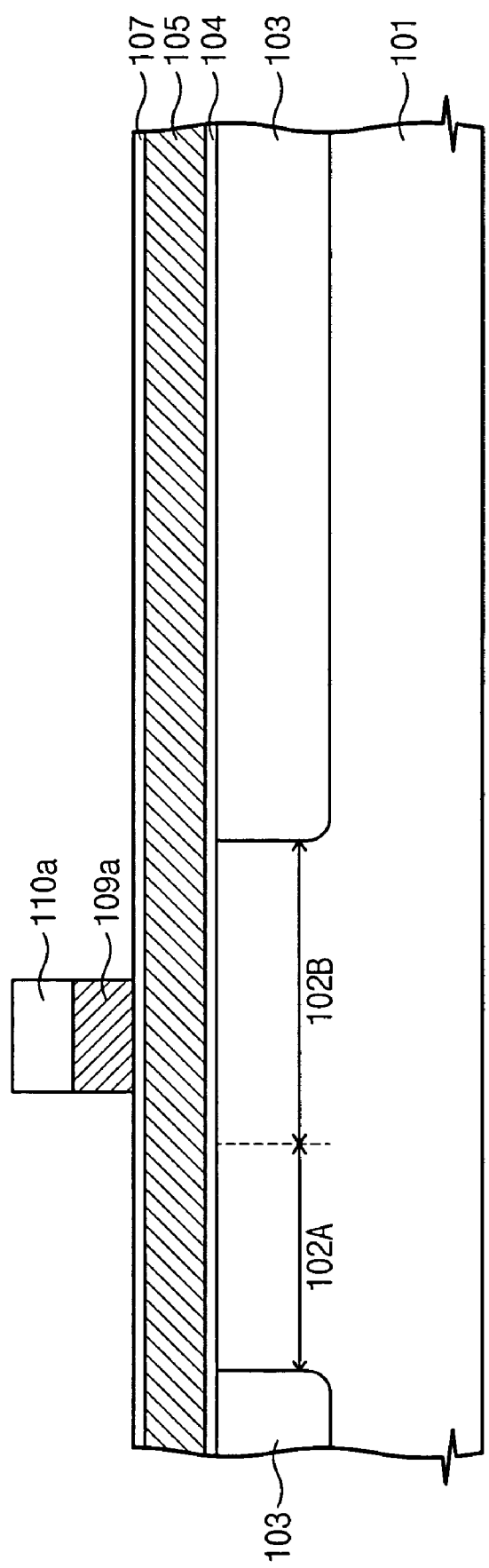
Figure 9B:
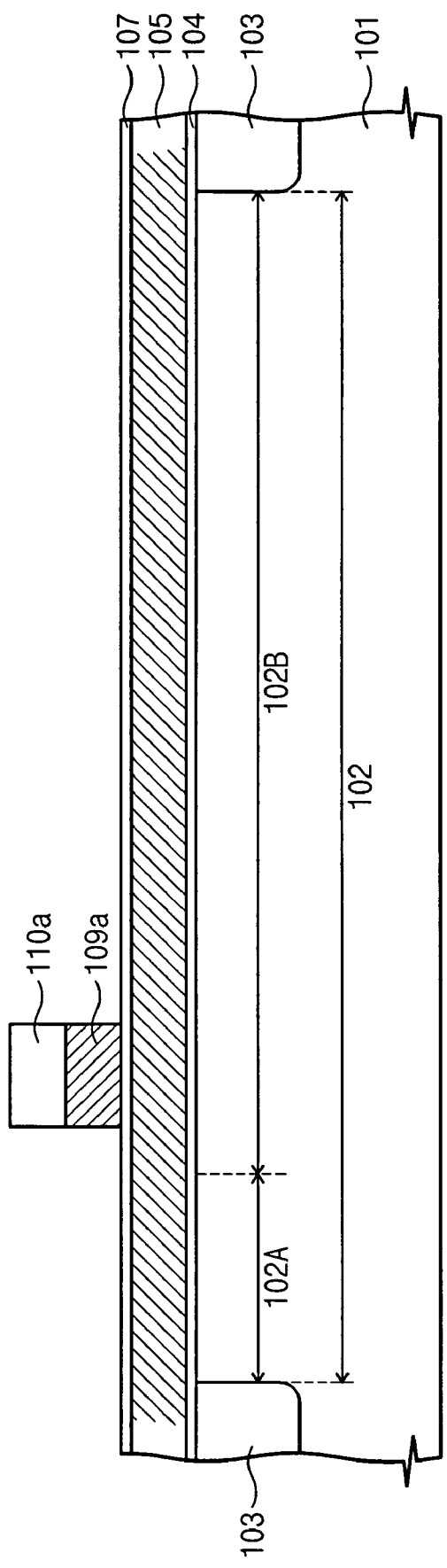

Next, referring to FIGS. 9A and 9B, a photolithography and etching process is carried out to form (pattern) the boosting gate (pattern) 109a from the second conductive film 109. (Meanwhile, the top electrode of the capacitor is formed in the peripheral circuit area (not shown)). The photolithography process is conducted to form a photoresist pattern 110a on the second conductive film 109. With the photoresist pattern 110a used as an etch mask, a portion of the second conductive film 109 is etched away to leave (form, pattern) the boosting gate (pattern) 109a within the pixel array area (and the top electrode of the capacitor in the peripheral circuit area, not shown).

Figure 10A:
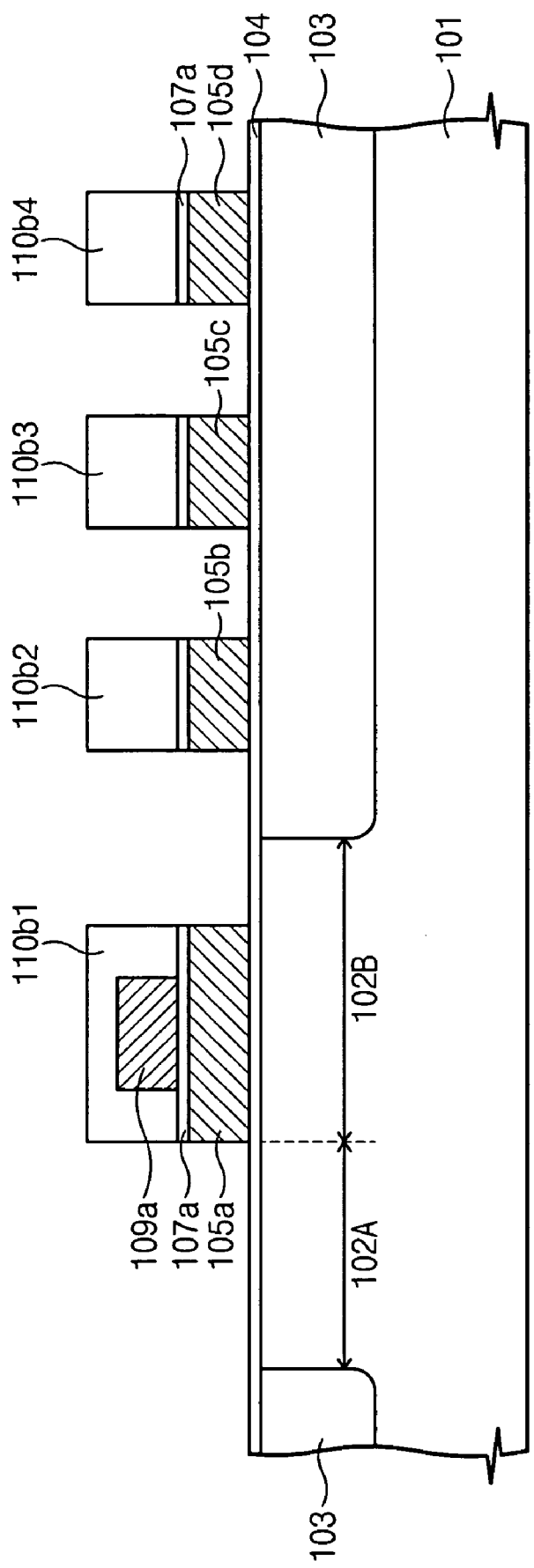
Figure 10B:
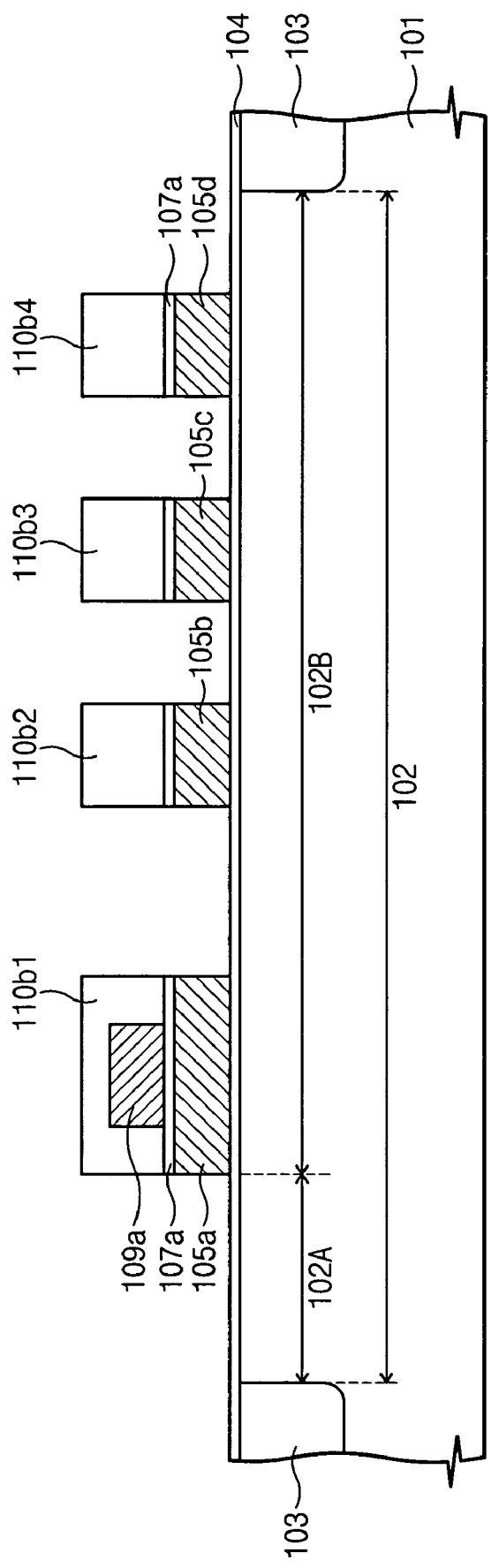

Referring to FIGS. 10A and 10B, a photolithography and etching process is carried out to form (pattern) the transfer gate 105a, the reset gate 105b, the drive gate 105c, and the selection gate 105d, from the first conductive film 105. The transfer gate 105a is aligned under the boosting gate 109a. (Meanwhile, in the peripheral circuit area, the dielectric film and bottom electrode of the capacitor are formed.) The photolithography process is conducted to form photoresist patterns 110b1, 110b2, 110b3, and 110b4 on the dielectric film 107. Here, the photoresist pattern 110bcovers the boosting gate (pattern) 109a, and defines the transfer gate 105a. The photoresist patterns 110b2, 110b3, and 110b4 define the reset gate 105b, the drive gate 105c, and the selection gate 105d, respectively. (Meanwhile, in the peripheral circuit area (not shown), the dielectric film and the first conductive film 105, are selectively etched away by means of the photoresist patterns 110b1~110b4 as etch masks.

Then, (referring to FIGS. 11A and 11B), after forming an ion implantation mask (not shown, the ion implantation mask is formed to uncover the active region 102A) for forming N-type regions of the photodiode, N-type ionic impurities are injected into the active region 102A to form the N-type region 111 of the photodiode as the photo-receiving device. The N-type region 111 is disposed at one side of the transfer gate 105a.

After forming an ion implantation mask (not shown, during this process, the ion implantation mask is formed to uncover the active region 102A) for forming a P-type region of the photodiode, P-type ionic impurities are injected into the N-type region 111 of the active region 102A to form the P-type region 113 of the photodiode as the photo-receiving device. As a result, the N-type and P-type regions, 111 and 113, constitute the photodiode 115.

For the purpose of preventing the signal charges, which are generated in the N-type region 111 of the photodiode 115, from leaking into the P-type substrate 103, after forming an N-type epitaxial silicon layer, a P-type well as a barrier layer may be formed to be interposed between the P-type substrate 103 and the N-type epitaxial silicon layer. The processing steps of forming the N-type epitaxial silicon layer and the P-type well are carried out before depositing the gate oxide film after completing the field isolation process.

An N-type ionic impurity implantation process is carried out to form N-type impurity diffusion regions (e.g., 117, 119, 121, 123) between adjacent gates in the substrate 103. The impurity diffusion region between the transfer gate 105a and the reset gate 105b functions as the floating diffusion region 117. The impurity diffusion region between the reset gate 105b and the drive gate 105c functions as the reset diffusion region 119 RD. And, the impurity diffusion regions between the drive gate 105c and the selection gate 105d, and between the selection gate 105d and the field isolation film 103, function as source and drain regions 121 and 123 (of transistors SG and DG, see FIG. 6A).

Figure 12A:
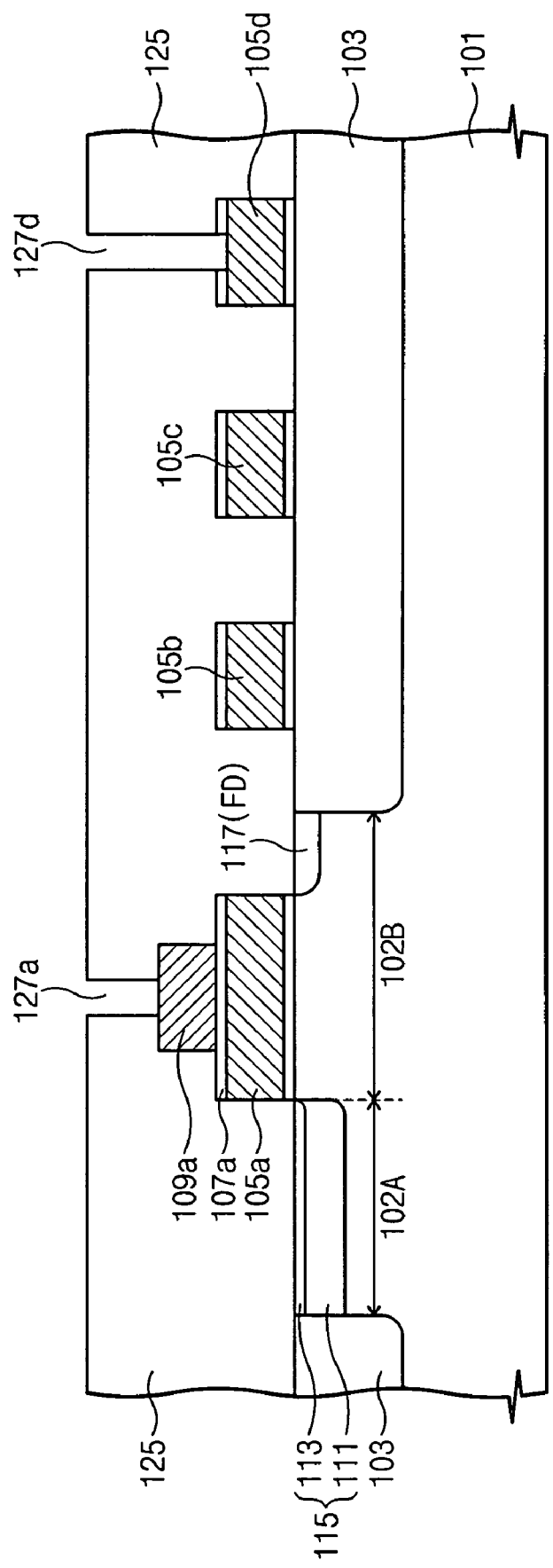
Figure 12B:
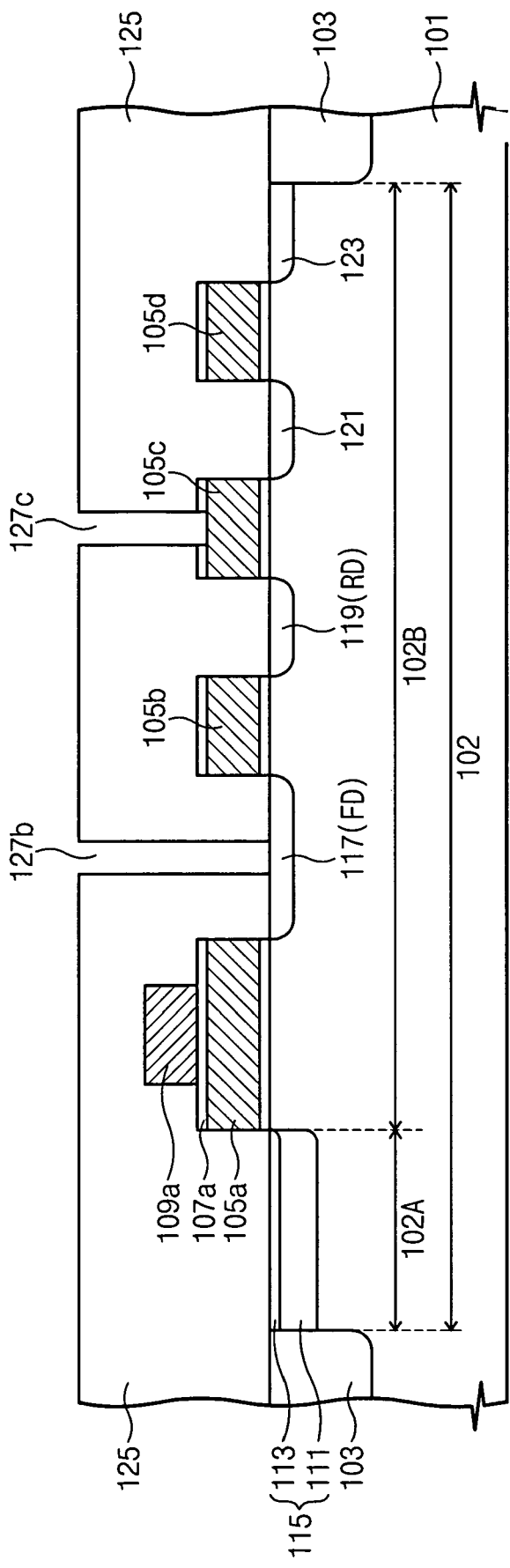

Next, referring to FIGS. 12A and 12B, after dielectric spacers are formed on sidewalls of the gates as an optional process, an interlevel insulation film 125 is deposited on the resultant structure. The interlevel insulation film 125 may be formed using a well-known film deposition process, e.g., being made of an insulation film of an oxide group.

Then, the interlevel insulation film 125 is patterned to form a contact hole 127a disclosing the boosting gate (pattern) 109a, a contact hole 127b disclosing the floating diffusion region 117, a contact hole 127c disclosing the drive gate 105c, and a contact hole 127d disclosing the selection gate 105d. Although not shown, contact holes disclosing the transfer and reset gates may be formed at the same time with the contact holes 127a~127d.

Figure 13A:
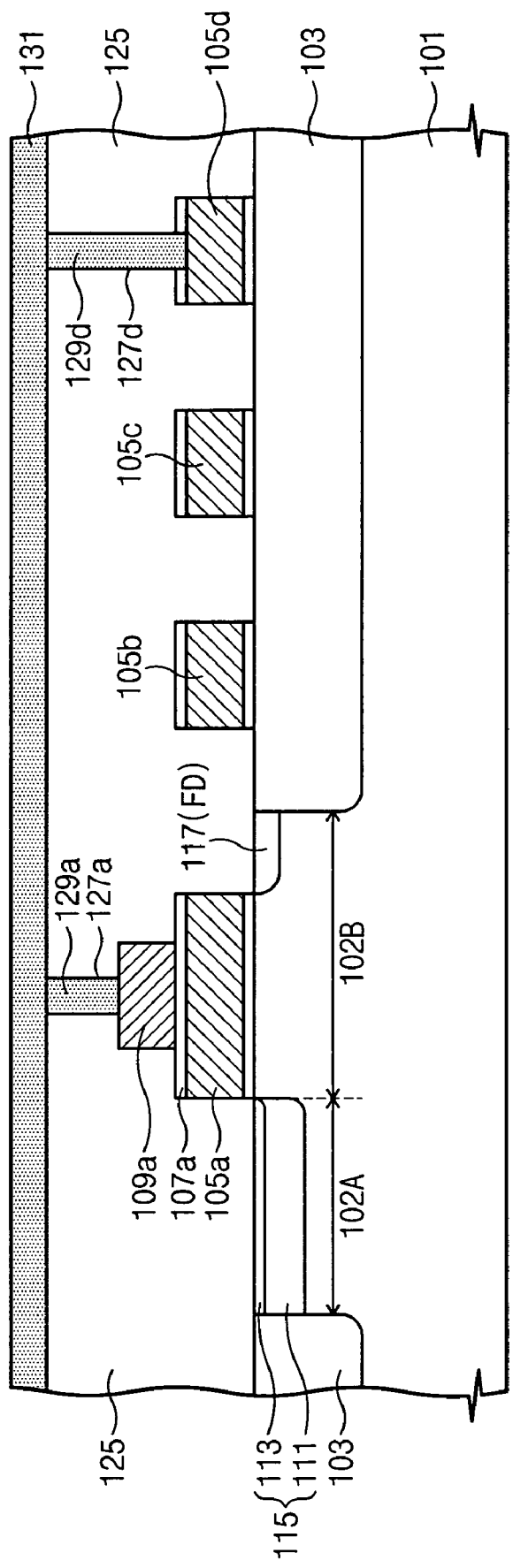
Figure 13B:
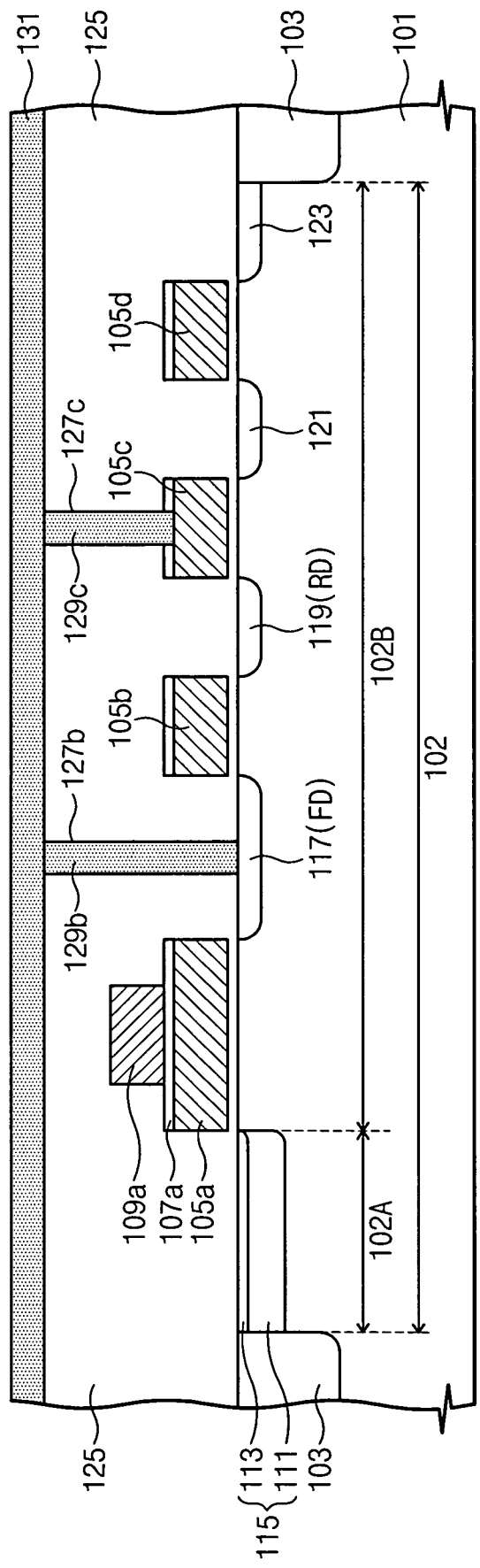

And, referring to FIGS. 13A and 13B, a conductive material (i.e., metal) film 131 is deposited on the interlevel insulation film 125 to fill up the contact holes 127a~127d. A photography and etching process is carried out upon the conductive material film 131, forming local metal interconnection lines including local metal interconnection line 131a that electrically connects the boosting gate 109a with the selection gate 105d through contact plugs 129a and 129d in the contact holes 127a and 127d, and local metal interconnection line 131b that electrically connects the floating diffusion region 117 with the drive gate 105c through contact plugs 129b and 129c in the contact holes 127b and 127c. During this process, contact plugs filling up the contact holes disclosing the transfer and reset gates may be formed.

Subsequently, usual processing steps are performed for completing the architecture of the CMOS image sensor, e.g., those of forming metal lines to apply control voltages to the local metal interconnection lines and contact plugs.

Another method of fabricating the image sensor according to another embodiment of the invention t is similar to that by the last described method embodiment, except that the boosting gate is formed over the drive gate (see FIGS. 5A to 5C). In this case, the boosting gate over the drive gate is electrically connected to the selection gate.

Although the present invention has been described in connection with the exemplary embodiments of the present invention illustrated in the accompanying drawings, it is not limited thereto. It will be apparent to those skilled in the art that various substitution, modifications and changes may be thereto without departing from the scope and spirit of the invention.

According to the features of the invention described above, the boosting gate is disposed over the transfer gate and/or the drive gate with an interposing dielectric film, and is electrically connected to the selection gate. Therefore, when the selection voltage is applied to the selection gate (e.g., after floating the transfer gate), it is possible to enhance the transfer efficiency of the signal charges generated in the photo-receiving device because the floated transfer gate is coupled with a predetermined voltage having the effect of capacitive self-boosting.

Moreover, the dynamic range of the image sensor may be increased or adjusted, since the electrostatic potential floating diffusion region is variable.

What is claimed is:

1. A image sensor including a pixel, the pixel comprising:
a photo-receiving device formed in a semiconductor substrate, configured to generate charges in response to light;
a transfer transistor, having a transfer gate electrode formed on the semiconductor substrate, configured to transfer the charges from the photo-receiving device to a floating diffusion region formed in the semiconductor substrate;
a drive transistor, having a drive gate electrode formed on the semiconductor substrate;
a selection transistor, having a selection gate electrode formed on the semiconductor substrate; and
a boosting gate electrode capacitively coupled to one of the transfer gate electrode or the drive gate electrode
wherein the boosting gate electrode is electrically connected to the selection gate electrode.

2. The image sensor as set forth in claim 1, further comprising:
a reset transistor, having a reset gate electrode formed on the semiconductor substrate, configured to discharge the charges from the floating diffusion region to a reset diffusion region.

3. The image sensor as set forth in claim 1, wherein the photo-receiving device is a photodiode.

4. A image sensor including a pixel, the pixel comprising:
a photo-receiving device formed in a semiconductor substrate, configured to generate charges in response to light;
a transfer transistor, having a transfer gate electrode formed on the semiconductor substrate, configured to transfer the charges from the photo-receiving device to a floating diffusion region formed in the semiconductor substrate;
a drive transistor, having a drive gate electrode formed on the semiconductor substrate;
a selection transistor, having a selection gate electrode formed on the semiconductor substrate; and
a boosting gate electrode capacitively coupled to one of the transfer gate electrode or the drive gate electrode,
wherein the boosting gate electrode is electrically connected to the selection gate electrode,
wherein the transfer transistor and the boosting transistor are configured so that charges are transferred from the photo-receiving device to the floating diffusion region when: an applied transfer voltage forms a channel in the semiconductor substrate under the transfer gate electrode and the transfer voltage is removed to float the transfer gate electrode; and a boosting voltage is applied to the boosting gate electrode bringing the transfer gate electrode to a voltage higher than the transfer voltage.

5. The image sensor as set forth in claim 4, wherein a voltage applied to the selection gate electrode is used as the boosting voltage.

6. A image sensor including a pixel, the pixel comprising:
a photo-receiving device formed in a semiconductor substrate, configured to generate charges in response to light;
a transfer transistor, having a transfer gate electrode formed on the semiconductor substrate, configured to transfer the charges from the photo-receiving device to a floating diffusion region formed in the semiconductor substrate;
a drive transistor, having a drive gate electrode formed on the semiconductor substrate;
a selection transistor, having a selection gate electrode formed on the semiconductor substrate; and
a boosting gate electrode capacitively coupled to one of the transfer gate electrode or the drive gate electrode,
wherein the boosting gate electrode is electrically connected to the selection gate electrode,
wherein the transfer gate electrode is configured to float having a capacitance storing a transfer voltage, and wherein the boosting gate electrode and the transfer gate electrode are stacked so that a voltage applied to the boosting gate electrode is capacitively coupled to the transfer gate electrode.

* * * * *